United States Patent [19]
Kuznicki

[11] Patent Number: 5,935,345
[45] Date of Patent: Aug. 10, 1999

[54] PROCESS FOR THE PRODUCTION OF A PHOTOVOLTAIC MATERIAL OR DEVICE, MATERIAL OR DEVICE THUS OBTAINED, AND PHOTOCELL COMPRISING SUCH A MATERIAL OR DEVICE

[75] Inventor: Zbigniew T. Kuznicki, Hoenheim, France

[73] Assignee: Centre National de la Recherche Scientifique, Etablissement Public a Caractere Scientifique et Technologique, Paris, France

[21] Appl. No.: 08/765,948

[22] PCT Filed: Jul. 13, 1995

[86] PCT No.: PCT/FR95/00945

§ 371 Date: Jan. 13, 1997

§ 102(e) Date: Jan. 13, 1997

[87] PCT Pub. No.: WO96/02948

PCT Pub. Date: Feb. 1, 1996

[30] Foreign Application Priority Data

Jul. 13, 1994 [FR] France .................................. 94/08885

[51] Int. Cl.$^6$ ................................................... H01L 31/00
[52] U.S. Cl. ............................ 136/255; 438/97; 438/488
[58] Field of Search .............................. 136/255; 438/97, 438/488

[56] References Cited

PUBLICATIONS

Z. Kuznicki et al., "Infrared Absorption of a New Very High Efficiency Si Solar Cell", 12th European Photovoltaic Solar Energy Conference, Apr. 11–15, 1994, vol. 1, pp. 1056–1059.

Z. Kuznicki et al., "A Method of L–H Interface Insertion for Very High Efficiency Silicon Cells", 12th European Photovoltaic Solar Energy Conference, Apr. 11–15, 1994, vol. 1. pp. 793–796.

Z. Kuznicki, "L–H Inteface Improvement for Ultra–High–Efficiency Si Solar Cells", J. Appl. Phys., vol. 74, No. 3, Aug. 1, 1993, pp. 2058–2063.

Z. Kuznicki et al., "Some Electrical Properties of a New Very High Efficiency Si Solar Cell with L–H Interfaces", 12th European Photovoltaic Solar Energy Conference, Apr. 11–15, 1994, vol. 1, pp. 552–555.

Z. Kuznicki et al., "A New L–H Interface Concept for Very High Efficiency Silicon Solar Cells", 23rd IEEE Photovoltaic Specialists Conference, May 10, 1993, pp. 327–331.

C. Summonte et al., "Spectral Behavoir of Solar Cells based on the "Junction Near Local Defect Layer" Design", Appl. Phys. Lett., vol. 3, No. 6, Aug. 9, 1993, pp. 785–787.

J. Li et al., "35% Efficient Nonconcentrating Novel Silicon Solar Cell", Appl. Phys. Lett., vol. 60, No. 18, May 4, 1992, pp. 2240–2242.

Z. Kuznicki, "Some Aspects of the Multi–Interface Structure for BSF Solar Cells", Solar Energy Materials and Solar Cells, vol. 31, 1993, pp. 383–399.

*Primary Examiner*—Mark Chapman
*Attorney, Agent, or Firm*—Young & Thompson

[57] ABSTRACT

A process for the production of a photovoltaic material or device based on monocrystalline silicon adapted to absorb particularly infrared radiation. A wafer, a slice or a chip region of monocrystalline silicon having a diffusion length greater than the path of the minorities in the base or greater than the total thickness of the wafer, slice or chip region, is obtained. Then the rear surface of the wafer, slice or chip region, not adapted to be exposed to photovoltaic radiation, is treated so as to create a rear field as well as zones or points of electrical contact. Then the forward surface is treated so as to form a thin surface emitter layer, a P-N junction of shallow depth, as well as a continuous flat substructure strongly doped, embedded in the emitter, of very small thickness and provided with several crystalline and electrical interfaces, particularly two interfaces of the L-H type and two crystalline hetero-interfaces. Finally, the slice, wafer or chip region, particularly the surface having the emitter, is subjected to a thermal treatment, for predetermined times and temperatures, so as to obtain in the emitter layer a hetero-structure of different materials or of materials of different crystallinities, particularly a structure with at least three layers of monocrystalline silicon/amorphous silicon or modified/monocrystalline silicon type, coinciding with the doping profile adopted.

43 Claims, 26 Drawing Sheets

PROCESS FOR THE PRODUCTION OF A PHOTOVOLTAIC MATERIAL OR DEVICE, MATERIAL OR DEVICE THUS OBTAINED, AND PHOTOCELL COMPRISING SUCH A MATERIAL OR DEVICE

The present invention relates to the field of the conversion of radiated solar energy into electrical energy, based on the photovoltaic effect, more particularly in the increase in output and efficiency of the photocells or solar cells, and has for its object a process for production of a photovoltaic material or device which can particularly absorb infrared radiation and convert it with an efficiency significantly exceeding unity, the material or the device thus obtained and a photocell or photovoltaic cell comprising such a material or device.

At present, high quality solar cells assembled in modules and fabricated on an industrial scale have an output which is to say a maximum power ratio of peak/incident photovoltaic flux, of the order of 12 to 13%.

These cells, widely commercialized, are constituted of a monocrystalline silicon material and generally have a structure emitter/base/rear field with a single P-N junction.

Moreover, the surface exposed to the photonic radiation is normally subjected to a passivation operation and is coated with an anti-reflective surface.

There also exists solar cells, comprising a P-N junction, produced in limited series in laboratories and whose output is about 23%.

However, these cells of higher performance require, for their production, on the one hand a base material of the type silicon FZ ("Floating Zone") of excellent quality and, on the other hand, between thirty and sixty different steps for their fabrication, so as to obtain particularly a complex exposed surface (formed by a multitude of juxtaposed pyramids) capable of trapping the incident light.

There results a process of fabrication of the photovoltaic material and hence of the cells which is very difficult to industrialize and a high cost, because of the fact of the starting material and the complexity of the production of the cell, which is very high, limiting their application to very specific fields and situations.

Moreover, it has recently been proposed to produce photocells based on monocrystalline silicon partially modified so as to attempt to enlarge the natural absorption spectrum of the starting material, particularly in the infrared range, and thereby to increase the output of the resultant photocell.

More particularly, the proposals set forth consist, by an implantation of hydrogen and a consecutive thermal treatment, in transforming to the local level the crystalline structure of the silicon to create a buried layer provided with extrinsic levels.

These different experimental approaches are particularly described in the following articles: "35% Efficient Nonconcentrating Novel Silicon Solar Cell", J. Li et al., *Appl. Phys. Lett.*, 60 (1992) 2240–2242; "A Study on Solar Cells Based on the "Junction Near Local Defect Layer" Design", C. Sumnote et al., 11*th E.C. Photovoltaic Solar Energy Conference*, Montreux, Switzerland, October 1992, pages 370 to 373 and "New Type of Silicon Material with High Quality Surface Layer on Insulating Defect Layer", *Electronic Letters*, 28 (1992) 652–653.

The most widespread practical embodiment of the proposals above is that known under the letters JNDT "Junction Near local Defect Layer") and consists in implanting through a mask a discontinuous substructure.

However, this discontinuous substructure without active interfaces eliminates any possibility of creating a second potential barrier necessary for the increase of the voltage of the open circuit $V_{OC}$ and it moreover has, a higher resistivity than that of the starting material.

Moreover, the speed of local recombination within the layer of defects is very high and the electrical field of the junction P-N is not sufficient to save the photogenerated carriers of the fault region.

Thus, all the carriers in excess of the same sign are directed in the same direction relative to the interface P-N and the electrical field is applied to the substructure as an external polarization. Moreover, the length of the mean path of the photogenerated carriers in the substructure is about equal to half the thickness of the substructure and the presence of centers of recombination diminishes substantially the duration of effective live of the carriers.

Because of this, the possibility of extraction of the photocarriers from the substructure before their recombination is very low in the devices and the materials described in the above publications.

Moreover, the modified layer in the emitter of submicroscopic thickness is comprised by bubbles in which also the silicon and the hydrogen are absent, the recovery reducing the geometric dimensions of these cavities.

Finally, the infrared photogeneration zones of the layer of defects introduce new centers of recombination in the degrading emitter as well as the duration of the lifetime even in the same crystalline portion.

Finally, it will also be seen, particularly from the publications "Surface States and Buried Interface States Studies in Semiconductors by Photothermal Deflection Spectroscopy", Zammit U. et al., *J. Appl. Phys.*, 70 (1991) 7060–7064 and "Gapstates Distribution of Ion-Implanted Si and GaAs from Subgap Absorption Measurements", U. Zammit et al., *Phys. Rev. B*46 (1992) 7515–7518 a process of obtaining a material which can absorb partially infrared, said material being obtained from microcrystalline silicon modified in volume by implantation of doping impurities on a relatively thick layer, whose thickness and position cannot be controlled, thereby preventing any reproducibility identical to said process.

Still further, the activation of the doping impurities is no longer controlled and the limits of said layer with modified structure are not neatly defined, neither as to their position nor as to their shape, particularly their planarity.

Moreover, it has been determined that, although there is optical absorption of a part of the infrared radiation in the layer of modified structure, with however an action practically null on the photons whose energy is less than 0.5 eV, no optical absorption and hence no corresponding photocurrent having been detected, which raises the interest in an eventual industrial use (to the extent possible) in a material when the output will not be increased relative to a classic photopile, although smaller.

The present invention has particularly for its object to overcome the group of drawbacks recited, whilst providing in particular a photovoltaic material which can, over most of the visible light range, also absorb infrared radiation even of a wavelength longer than 3200 nm, and deliver a corresponding supplemental photocurrent, thereby increasing considerably the output of the photocells comprising such a material.

Moreover, another object of the invention is to improve the output of the photovoltaic conversion for ultraviolet radiations (UV) and those in the field of visible light.

To this end, the invention has for its object a process for production of a photovoltaic material or device based on monocrystalline silicon or polycrystalline with large grains being adapted to absorbed particularly the infrared radiation, characterized in that it consists in obtaining a plate, a slice or a region of monocrystalline or polycrystalline silicon chip, having a diffusion length greater than the distance between the minor axes of the base to be formed or greater than the total thickness of said plate, slice or region, then treating the rear face of said plate, slice or region of the mouse, not adapted to be exposed to photonic radiation, so as to create a rear field as well as zones or points of electrical contact, to subsequently treat the forward face in a manner to form a thin layer of emitter on a surface, a shallow junction P-N of small depth, as well as at least one substructure or continuous flat substructure very strongly angled, embedded in case of an emergency or on the base, of very small thickness, and provided, with several crystalline and electrical interfaces, particularly two interfaces of type L-H and two hetero-crystalline interfaces and, finally, submitting said slice, plate or region of mouse, particularly to face bearing the emitter, to a thermal treatment, at certain temperatures and during predetermined periods of time, so as to obtain in the external layer a hetero-structure of materials different or mechanical crystalline or different as to crystallinity, particularly a structure of at least three layers of the monocrystalline/amorphous silicon type or modified/ silicon monocrystals. A region of monocrystalline or polycrystalline silicon chip having a diffusion length greater than the path of the minority carriers in the base to be formed or greater than the total thickness of said plaque, then treating the rear surface of said plate, slice or mouse region, not adapted to be exposed to photonic radiation, so as to create a rear field as well as zones or points of electrical contact, treating the forward surface so as to form a thin layer of emitter on the surface, thereby to produce a P-N junction of small thickness, as well as at least one substructure in continuous plane configuration which is strongly doped, embedded in the emitter or in the base, of very small thickness and provided with several crystal and electrical interfaces, particularly two interfaces of the type L-H and of two hetero-crystalline interfaces and, finally, subjecting said slice, wafer or chip region, particularly the surface having the emitter, to a thermal treatment, at temperatures and for predetermined times so as to obtain, in the emitter layer, a hetero-structure of materials different from or materials of different crystallinities than the minerals who have, particularly a structure with at least three layers of the monocrystalline/amorphous silicon type or modified/silicon monocrystalline type, coinciding with the profile of doping adopted notably of known type under the designation δ-dopage and comprising industrial zones, electrical and mechanical constraints within the transition zones.

The invention also relates to a slice or wafer of photovoltaic material obtained by means of the process of production described above, consisting essentially of monocrystalline silicon or polycrystalline silicon with large grains and comprising a layer forming an emitter at its front face or adapted to be exposed, a rear field structure on its rear face (normally not exposed) and a P-N junction in the thickness of said slice or wafer, characterized in that it comprises moreover at least one continuous and strongly doped substructure of amorphous or modified silicon, buried particularly within the thickness of the emitter or in the base and of very small thickness, said at least one substructure or each substructure having a resistivity lower than that of the starting material and being delimited by crystalline interfaces and electrical planes, particularly by two flat crystalline hetero-interfaces and two homo-interfaces L-H, merged or not with the hetero-interfaces and corresponding to the limits of the substructure after implantation of the doping impurities or other agents and before the forming annealing, said at least one substructure being moreover provided on the one hand with opposed intrinsic electric fields formed at each homo-interface L-H promoting the extraction of the photogenerated minority carriers in said substructure and, on the other hand, of an intrinsic constrained field formed at each hetero-interface α-Si/c-Si and promoting the preservation of the centers of generation by impact, said slice or wafer of material constituting thus a multi-interface photovoltaic device.

Finally, the invention has for its object a photovoltaic cell or photopile, characterized in that it comprises as active material a portion of a slice or a wafer of photovoltaic material such as described above, the exposed surface of said portion of the slice or wafer being shaped and/or covered with a layer of material so determined as to constitute an optical confinement, particularly for infrared radiation, within the thickness of said active material.

The invention will be better understood from the following description, which relates to preferred embodiments, given by way of non-limiting examples, and explained with reference to the accompanying drawings, in which.

Figure 11A:
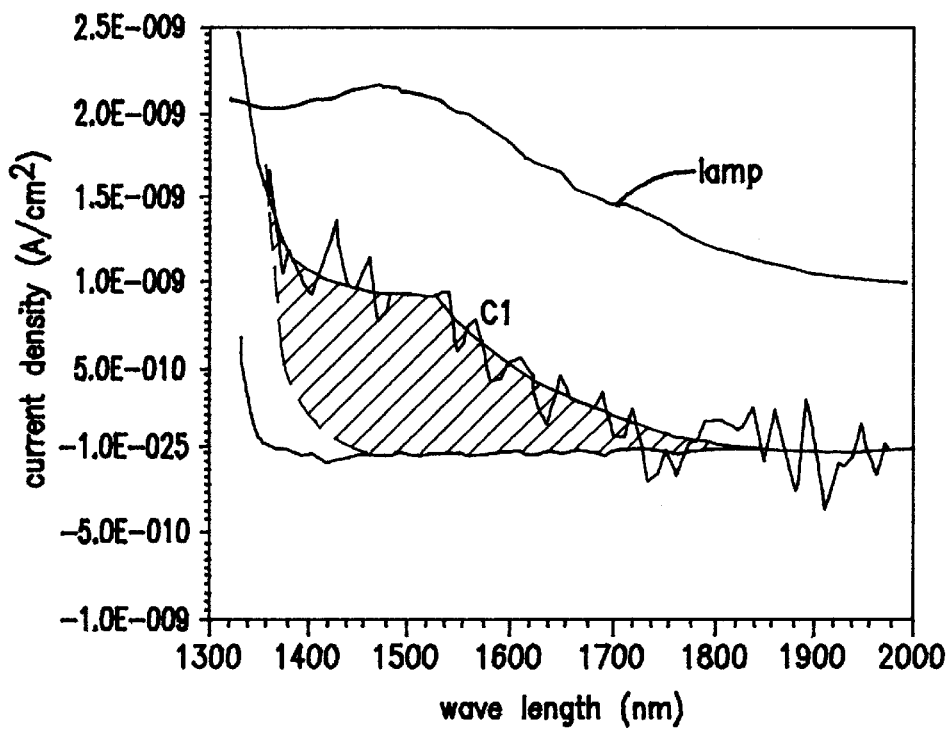
Figure 11B:
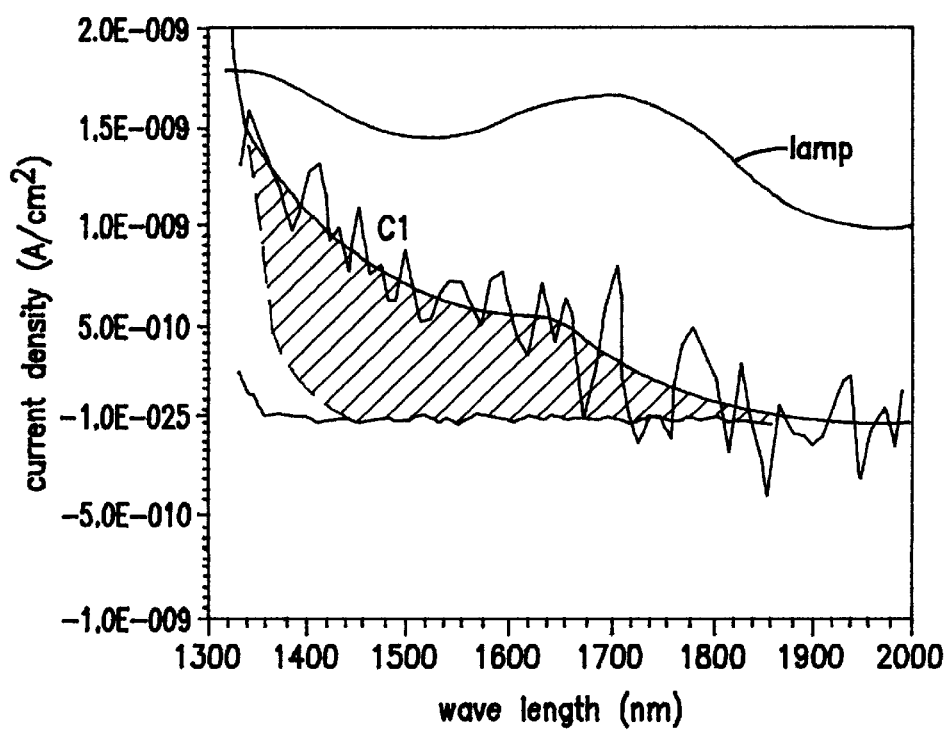
Figure 12:
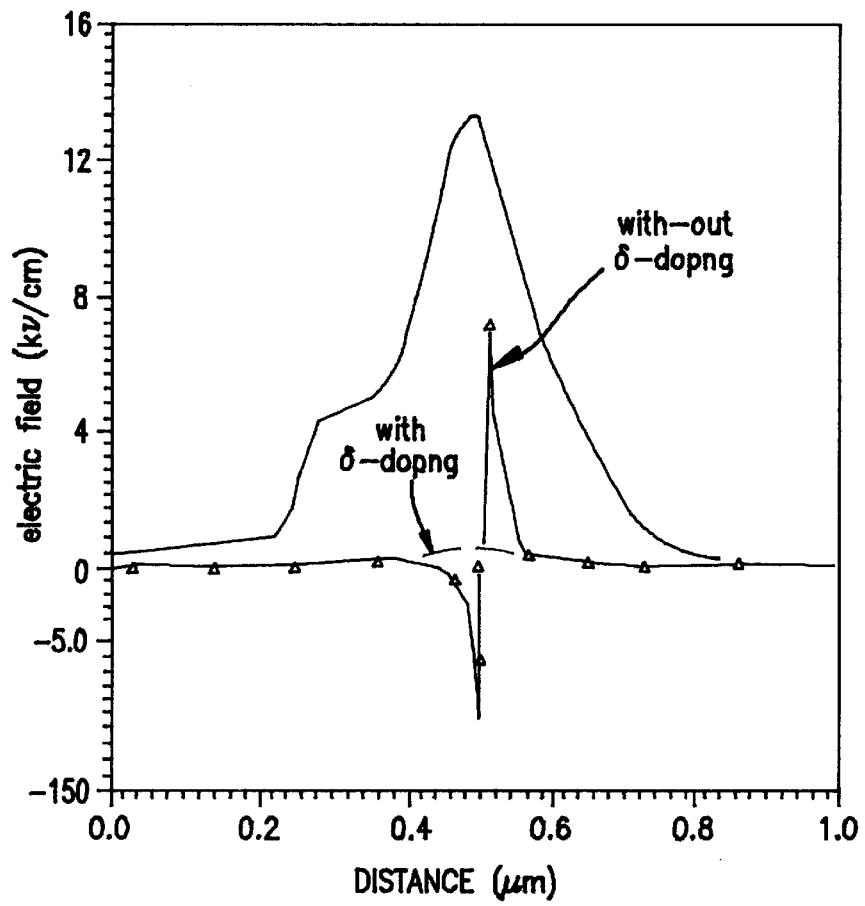
Figure 13:
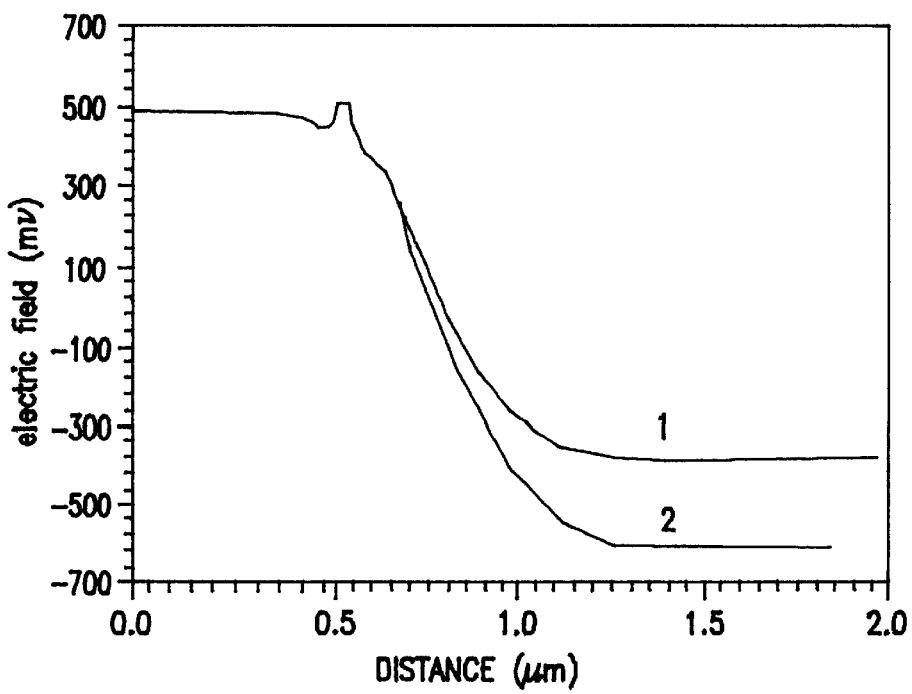
Figure 14:
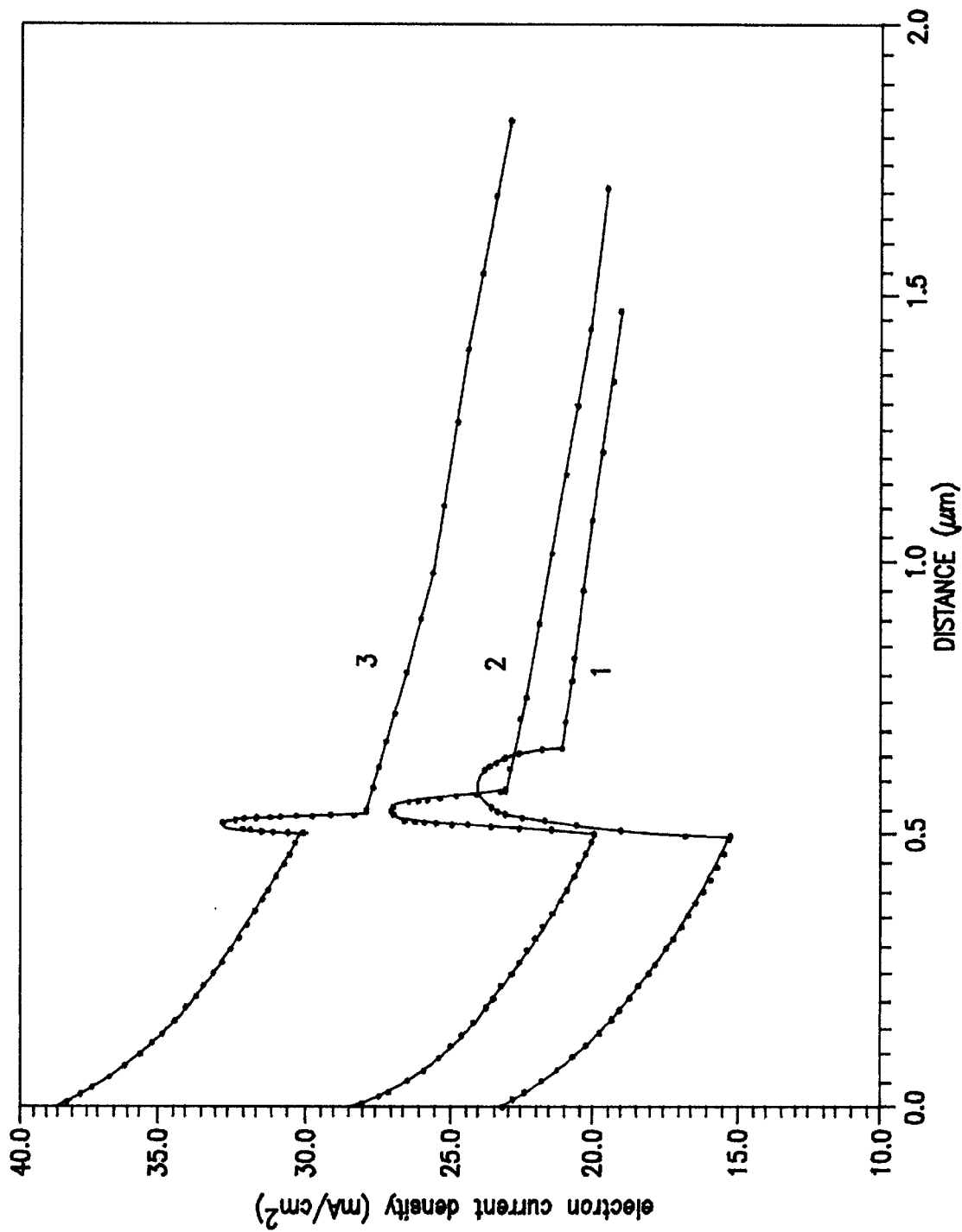
Figure 15:
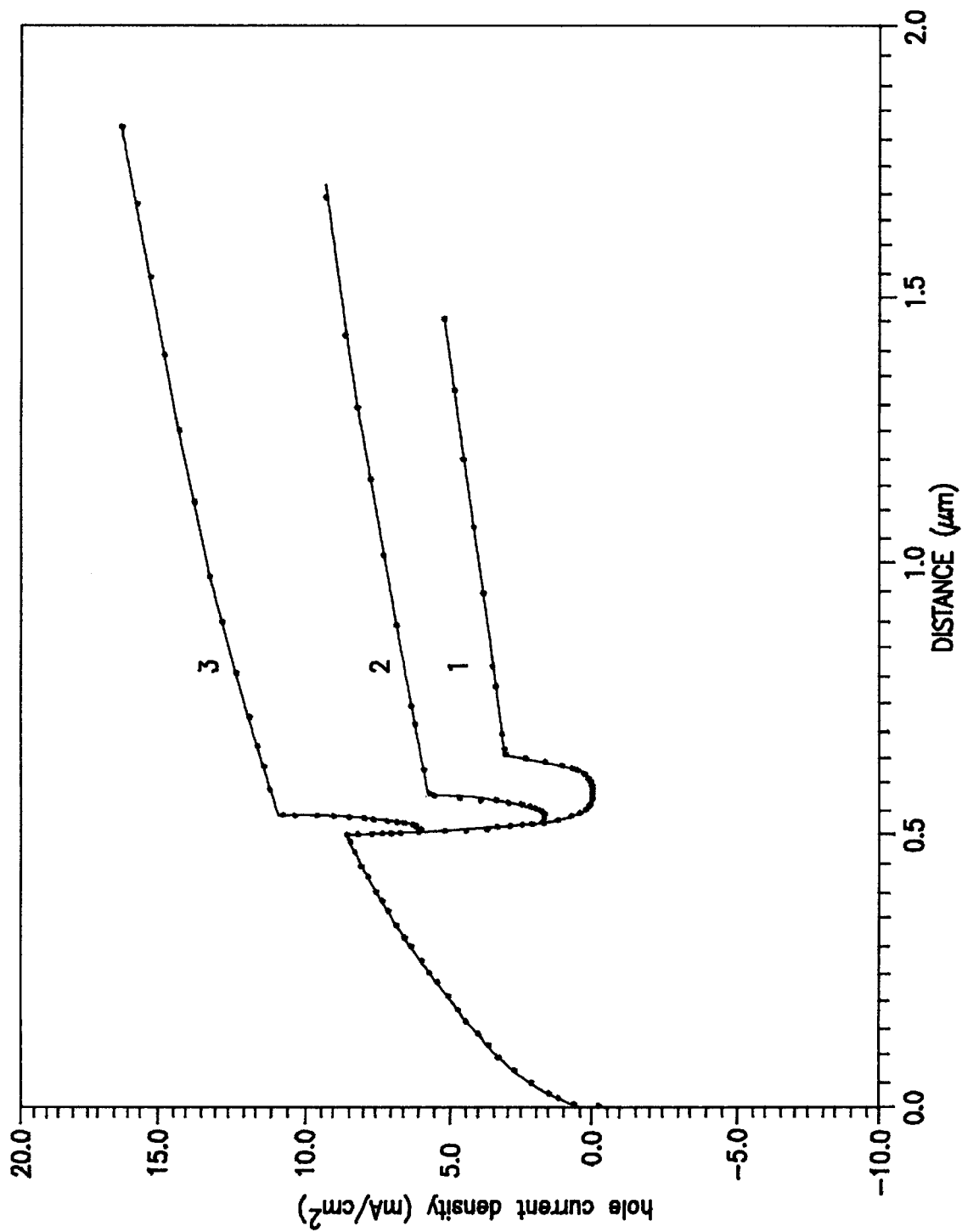
Figure 16:
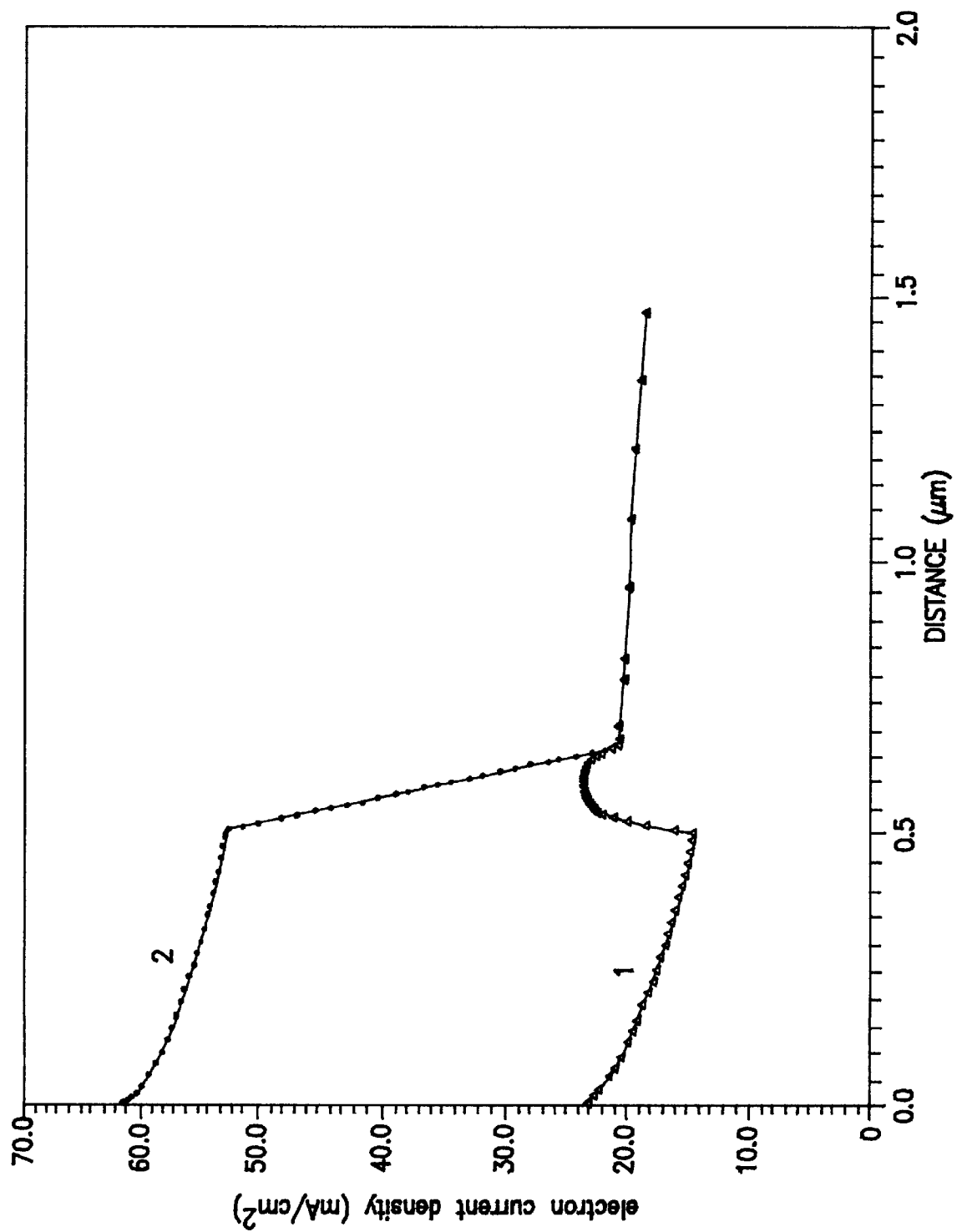
Figure 17:
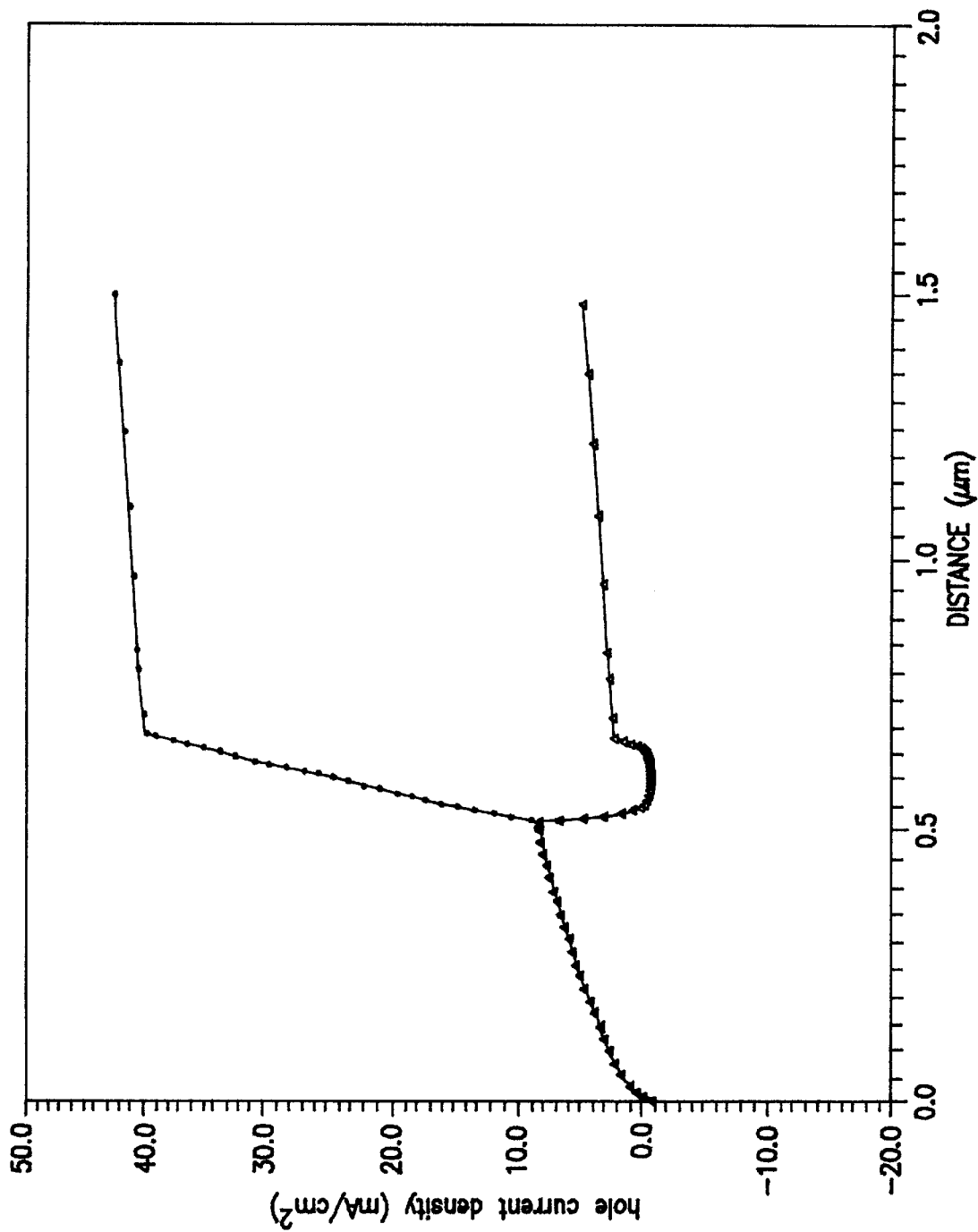
Figure 18:
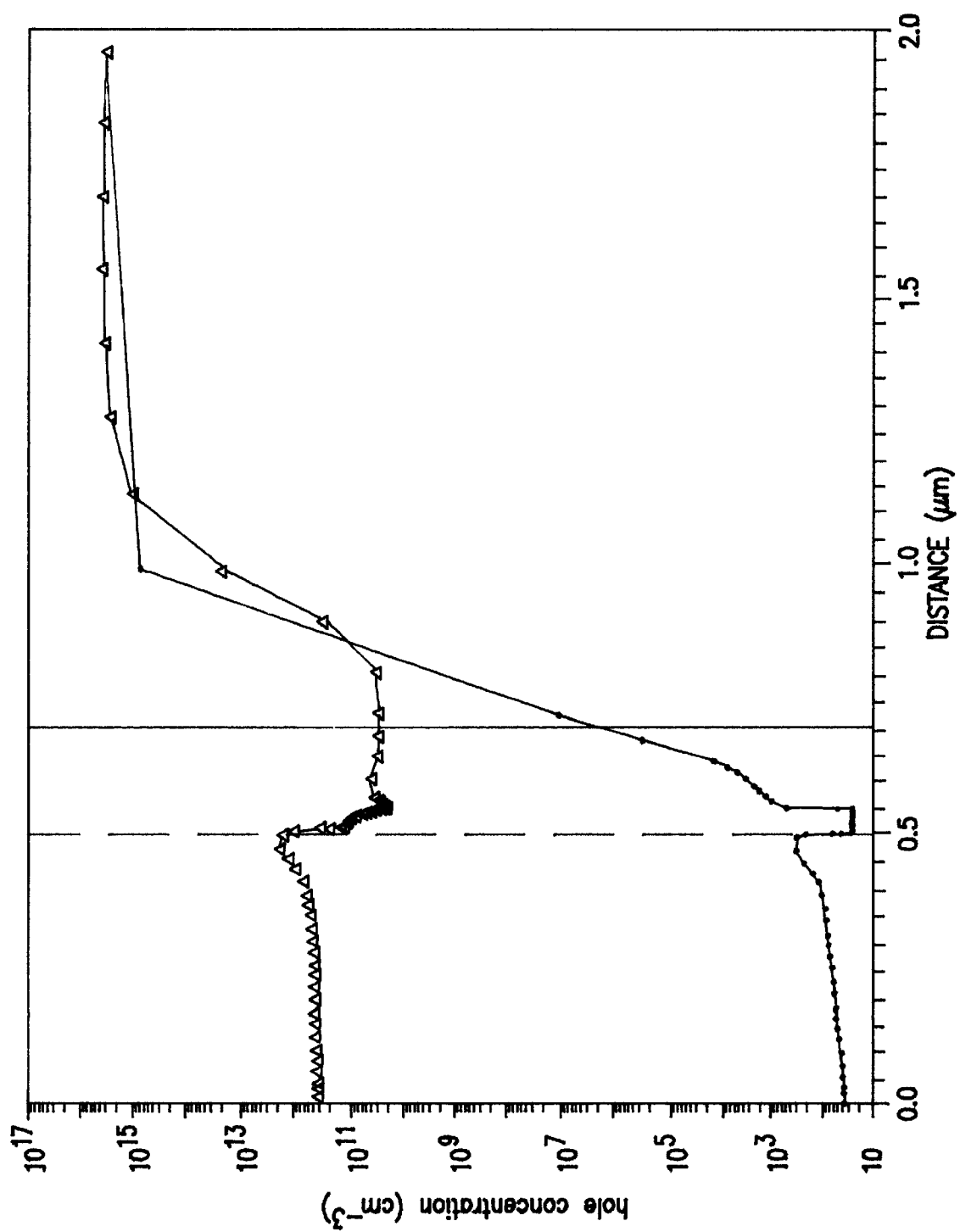
Figure 19A:
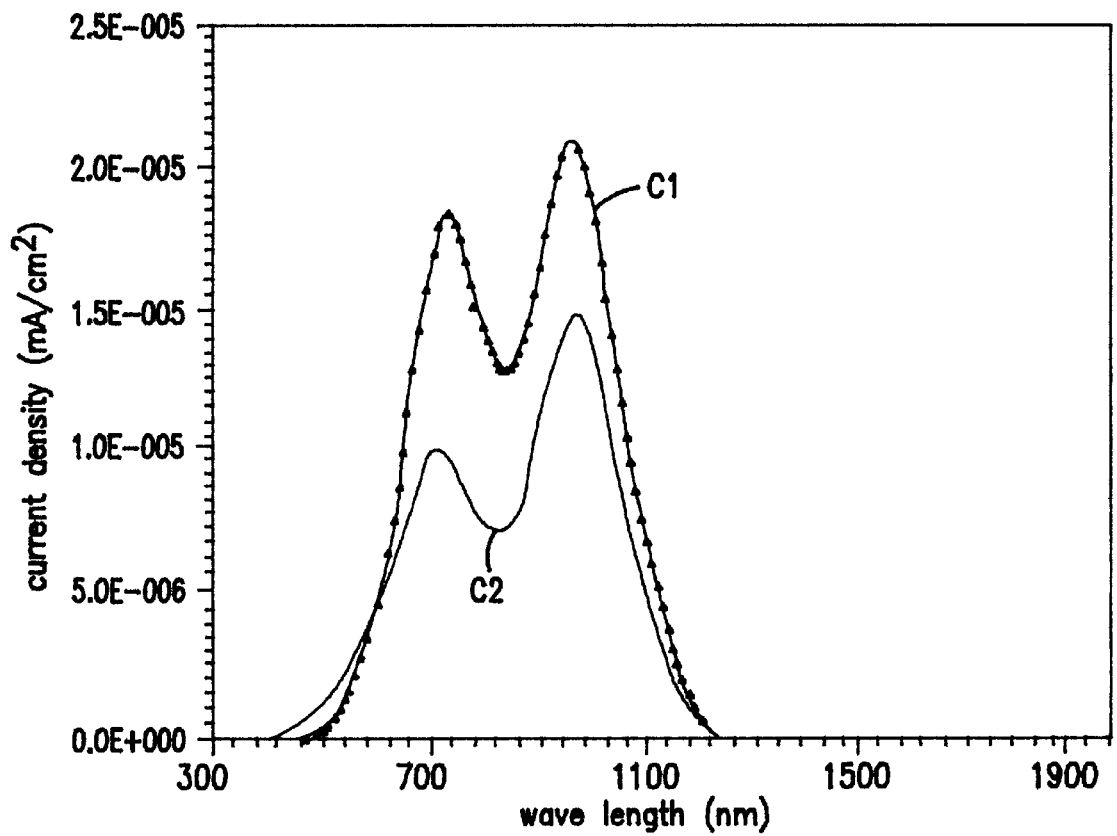
Figure 19B:
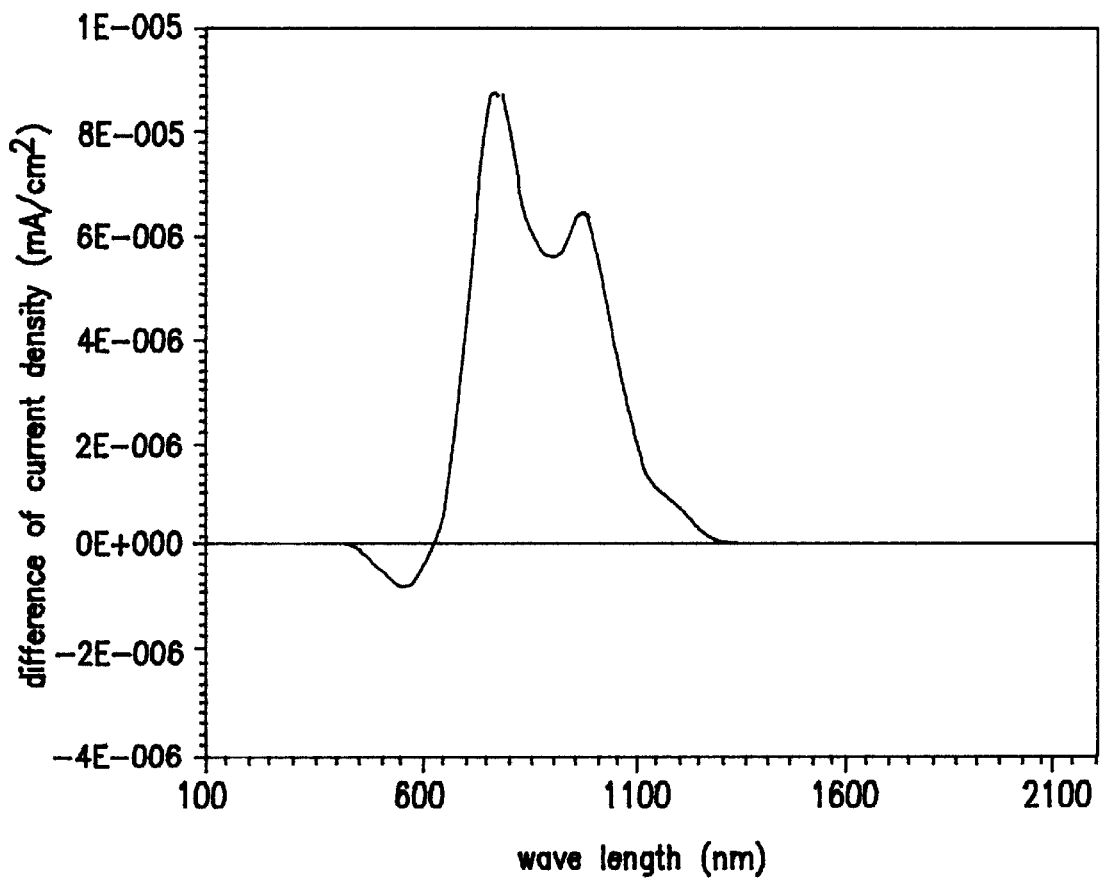
Figure 20A:
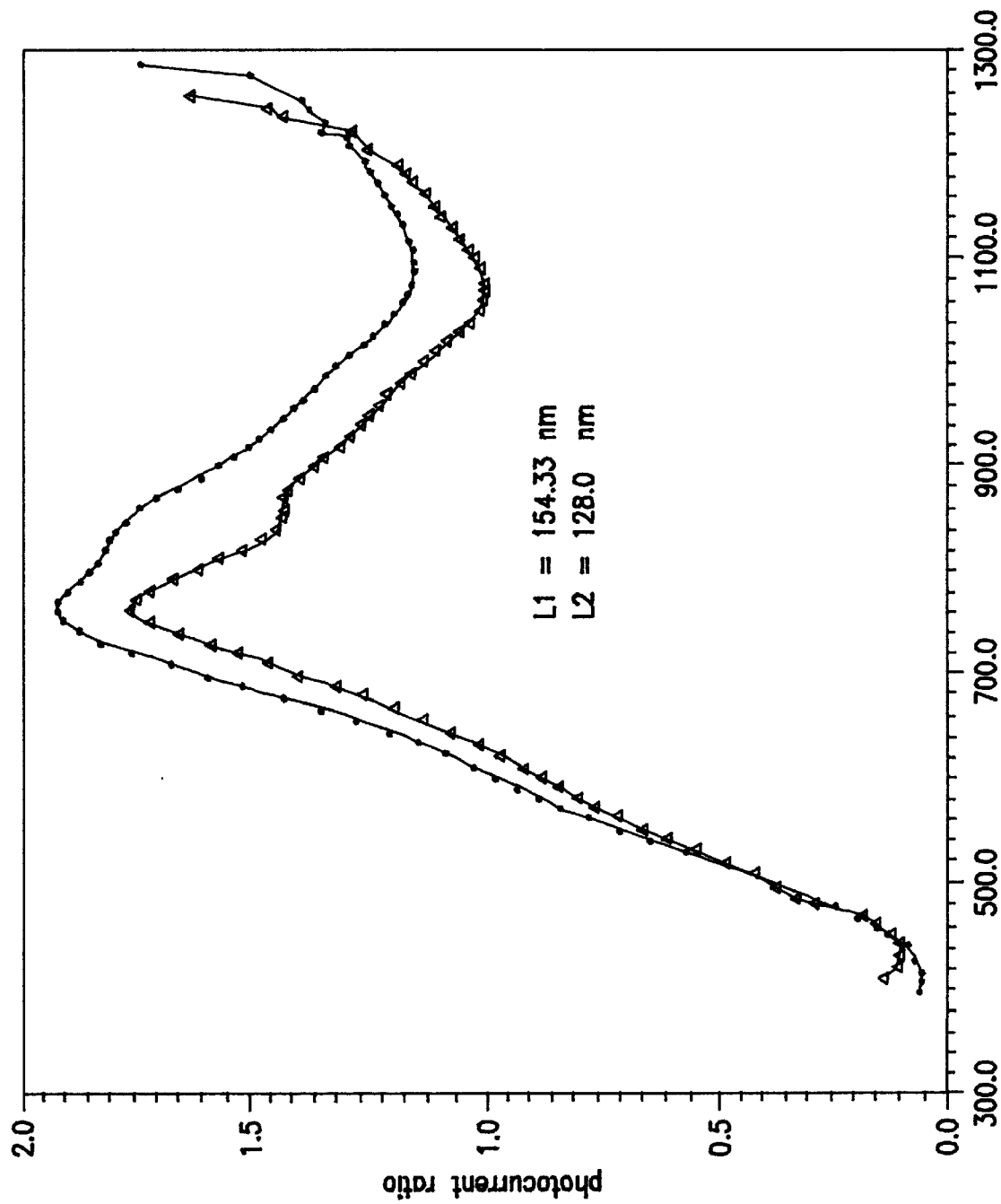
Figure 20B:
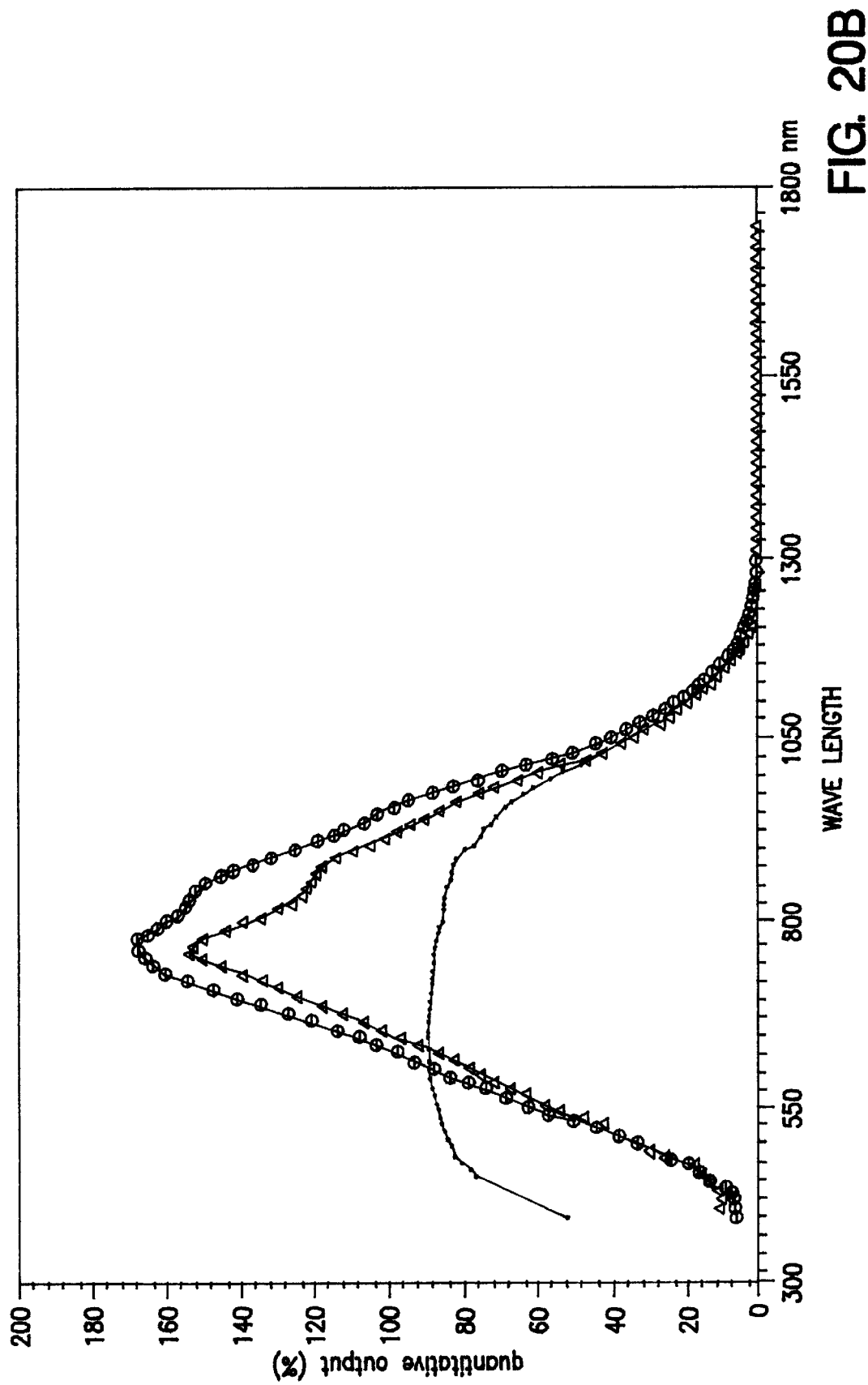
Figure 21:
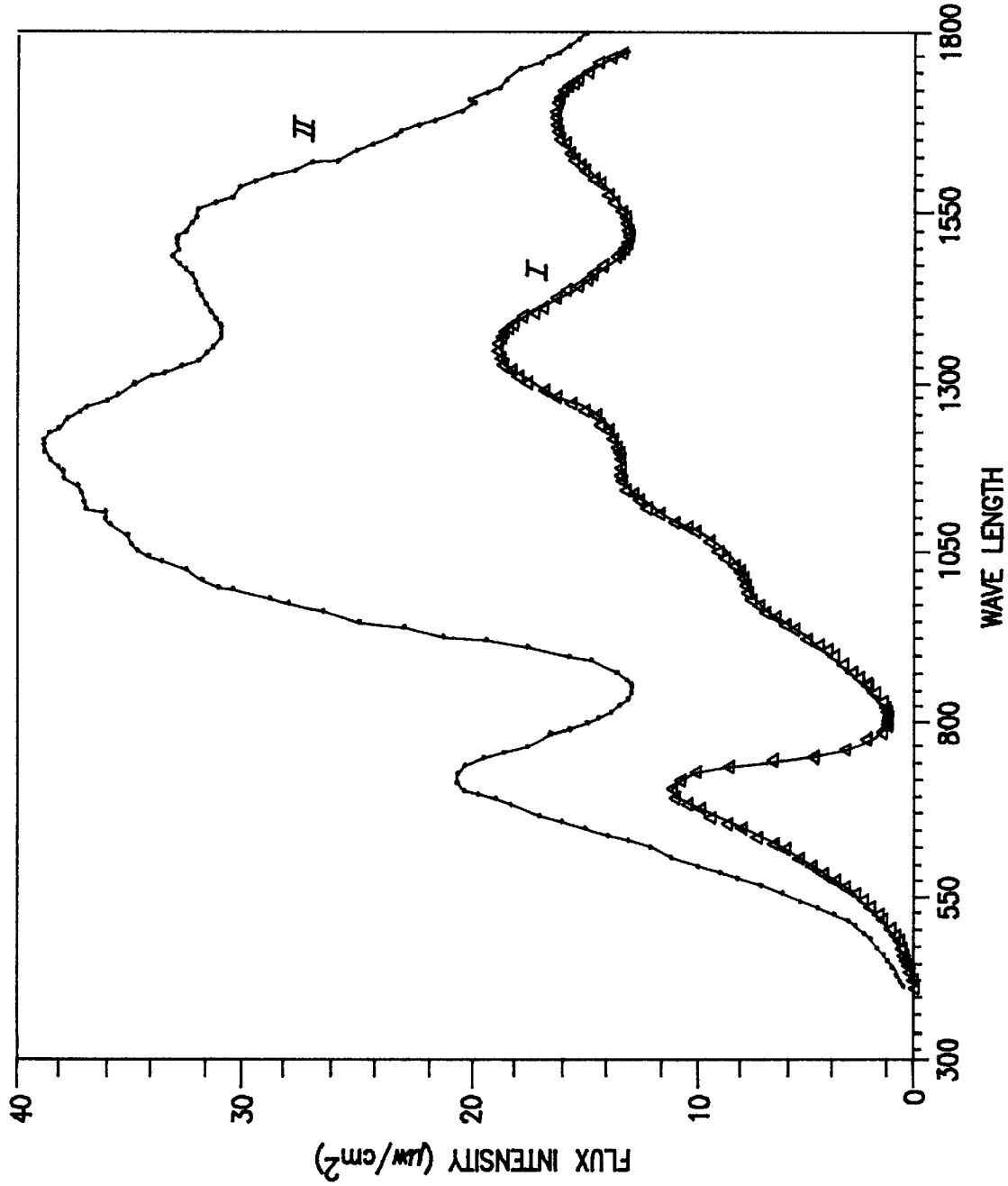
Figure 22A:
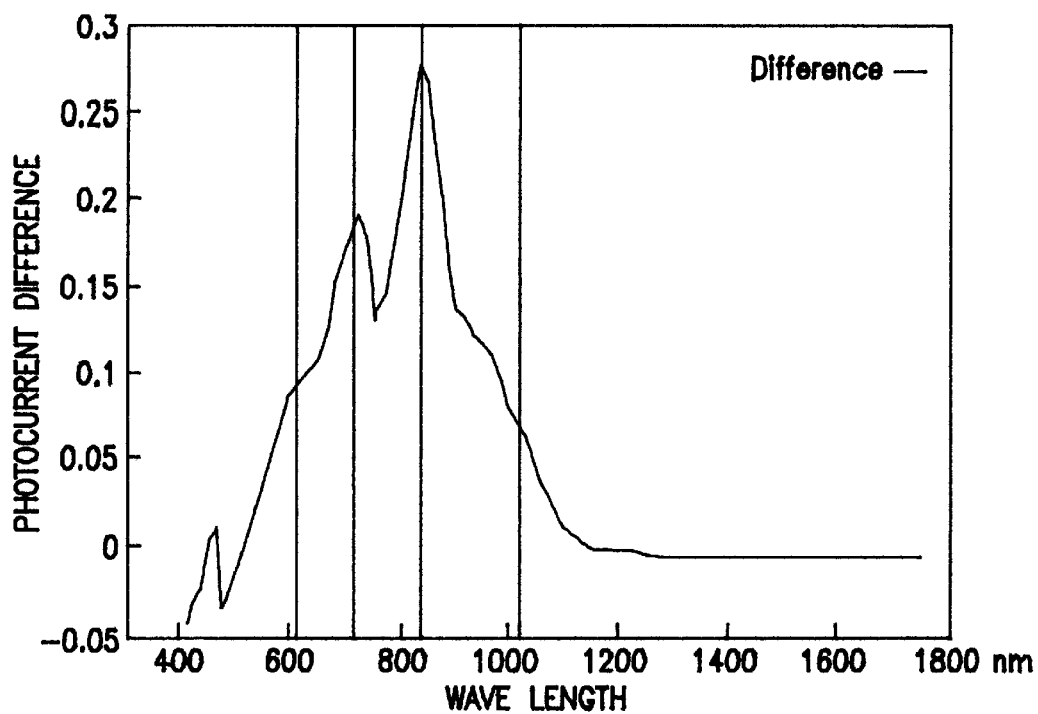
Figure 22B:
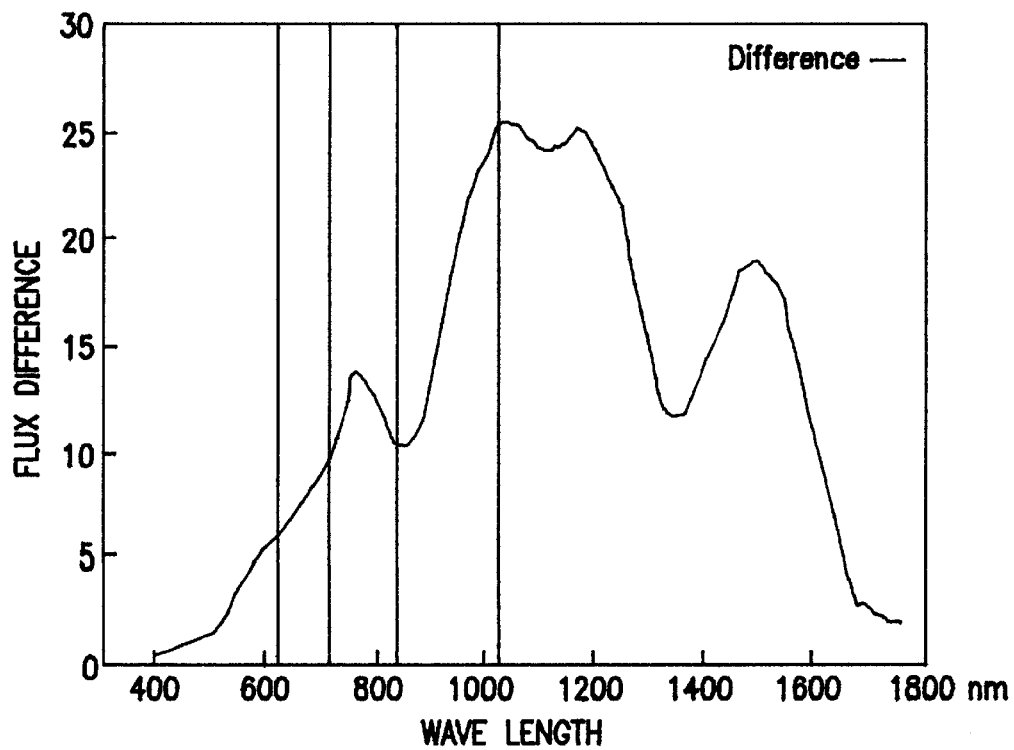
Figure 23B:
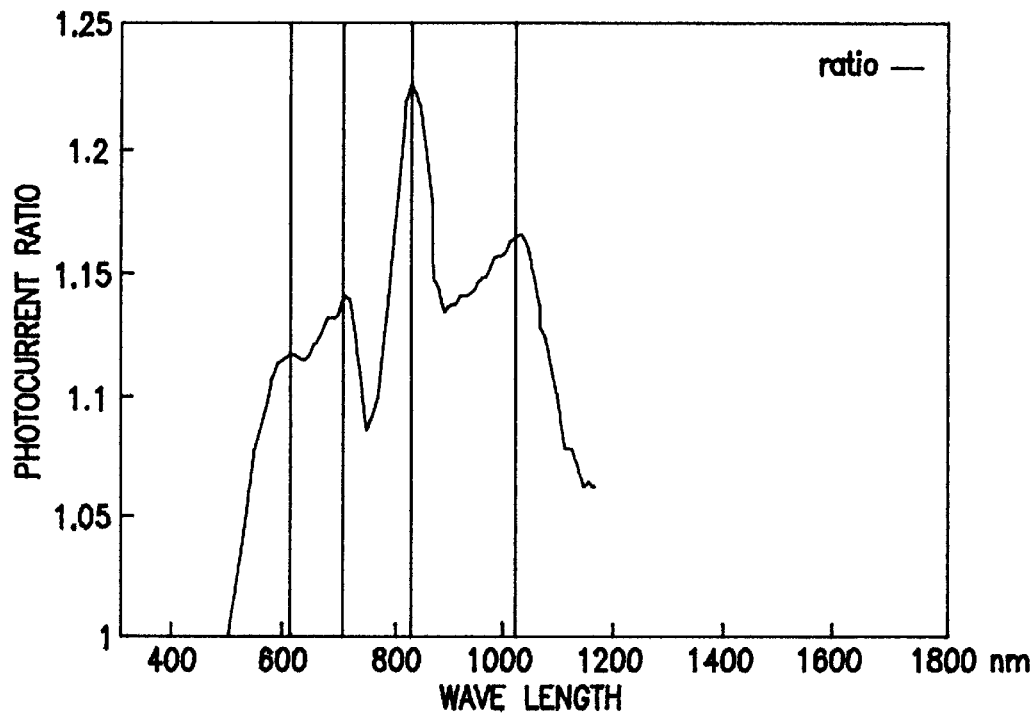
Figure 23A:
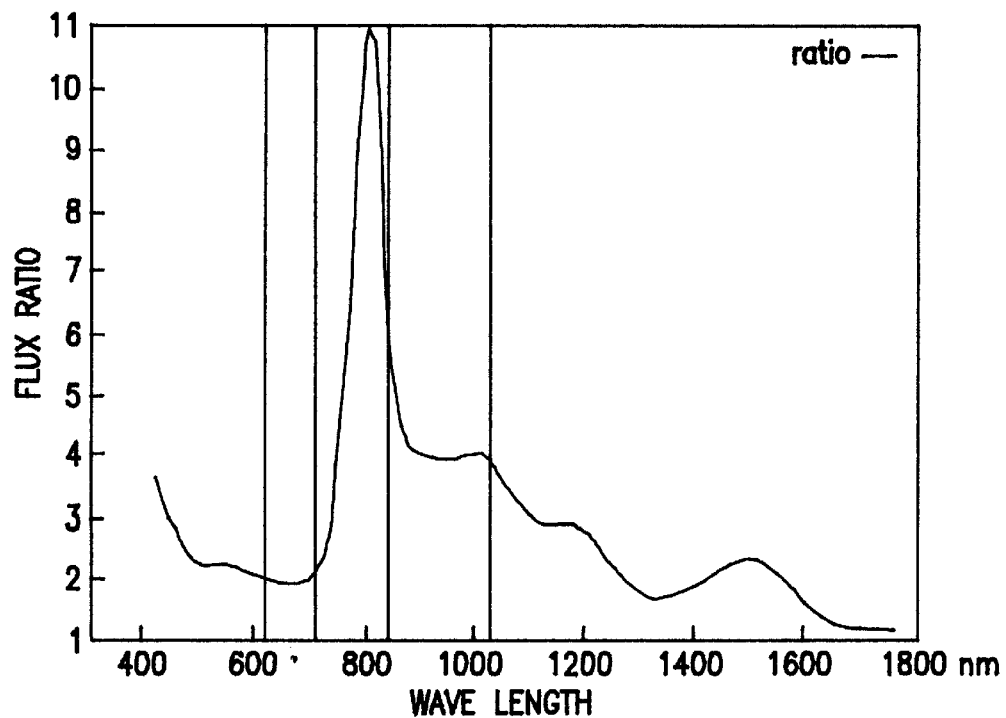
Figure 24:
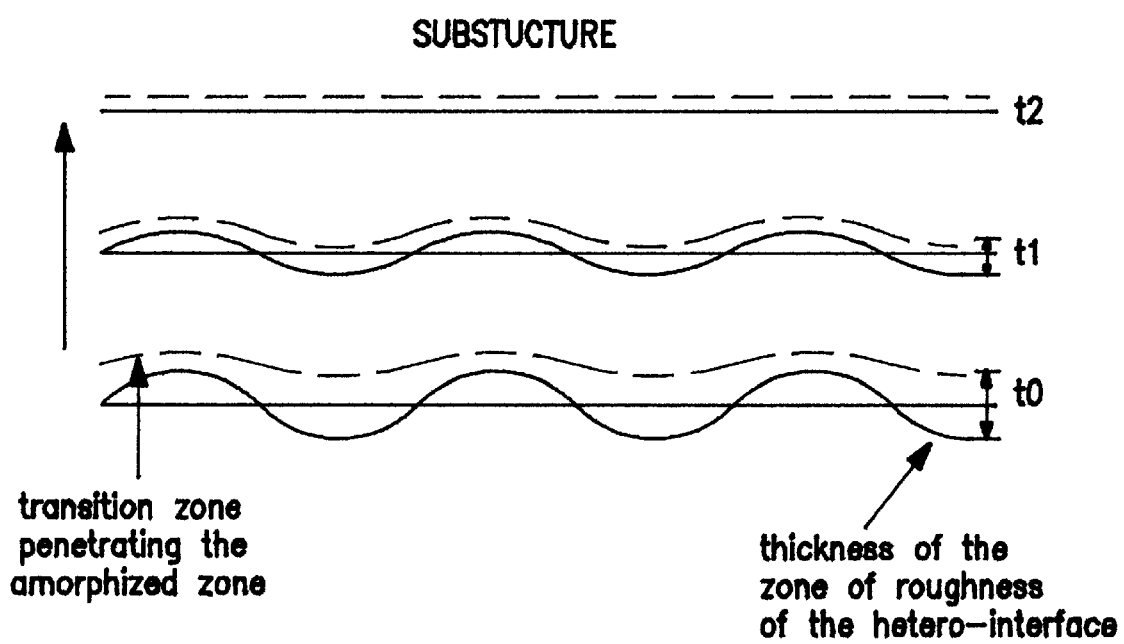

FIGS. 11A and 11B show the current densities as a function of the wavelengths, on the one hand, of a device of photovoltaic specimen according to the invention and provided with an absorbing substructure and on the other hand of a conventional photovoltaic device with an output of about 16%, with illuminations respectively operated by means of a monochromatic lamp with a narrower infrared spectrum (FIG. 11A) and by means of a monochromatic lamp with a wide infrared spectrum (FIG. 11B);

FIG. 12 shows the comparison of the distributions of the intrinsic electrical fields in a thin substructure with and without doping according to the invention (δ-doping);

FIG. 13 shows the distribution of electrical potential in a cell with a rear field provided with a rear field and with a substructure according to the invention of a thickness of 40 nm, in accordance with the duration of life of the carriers in said substructure;

FIG. 14 shows different distributions of current electrons (major carriers) as a function of the different thicknesses of the substructure, the lifetime of the substructure being $10^{-6}$ μs;

FIG. 15 shows, in a manner and under conditions similar to those of FIG. 14, different distributions of current of the holes (minority carriers);

FIGS. 16 and 17 show, by way of comparative example, respectively two distributions of currents of electrons and holes, for thick structures of 160 nm having different lifetimes;

FIG. 18 shows the concentrations at equilibrium and in a permanent regime under illumination of the holes for a lifetime of the substructure of 100 μs;

FIGS. 19A and 19B show respectively the comparative curves and the differential curve of the density of the photocurrent as a function of the wavelength in the UV spectrum and in the visible spectrum, between a reference cell of high quality (efficiency 16%) and a device or photovoltaic specimen according to the invention;

FIGS. 20A and 20B show respectively the curves of the ratio of the photocurrents between the reference cell and the device or photovoltaic specimen used for FIGS. 19A and 19B, and the quantitative curves of external efficiency for the same cell and the same device or specimen, obtained by two different light fluxes;

FIG. 21 shows the curves of flux intensity of photons for two lamps (I and II) with different spectral characteristics, used to obtain the curves of FIGS. 20A and 20B;

FIGS. 22A and 22B show respectively the differential curves of the photocurrents generated by the device or specimen used for the establishment of FIGS. 19A and 19B exposed to lamps I and II and photons fluxes of these two lamps I and II;

FIGS. 23A and 23B show respectively, for the two lamps I and II above, the ratios of the photon flows produced by these two lamps and the additional photocurrents generated in a device or a photovoltaic specimen according to the invention, and FIG. 24 is a schematic cross-sectional view showing the successive modifications at $t_0$, $t_1$ and $t_2$ of the local field of mechanical strength at the transition zone of a substructure in the course of thermal treatment producing epitaxis in the solid phase.

According to the invention, the production process which is the object of the present invention consists first in obtaining a wafer, a slice or a region of monocrystalline silicon chip having a diffusion length greater than the range of the minority carriers in the base to be formed or greater than the total thickness of said wafer, slice or chip region, then treating the rear surface of said wafer, slice or chip region, not adapted to be exposed to photoradiation, so as to create a rear field as well as regions or points of electrical contact and, as the case may be, amorphous regions across the thickness of the base and adjacent the rear surface, then treating the forward surface so as to form a thin surface emitter layer, a P-N junction of low height, as well as at least one very strongly-doped continuous flat substructure, embedded particularly in the emitter, of very small thickness and provided with several crystalline and electrical interfaces, particularly two interfaces of the L-H type and two crystalline hetero-interfaces, and, finally, subjecting said slice, wafer or chip region, particularly the surface forming the emitter, to a thermal treatment, at predetermined temperatures and times, so as to obtain, in the emitter layer, a hetero-structure of different materials or of materials of different crystallinity, particularly a structure with at least three layers of the silicon monocrystalline/amorphous silicon or modified/silicon monocrystalline type, coinciding with the doping profile adopted, particularly of the type known as δ-dopage (FIG. 3), and comprising intrinsic fields of mechanical and electrical constraint at the transition zones.

According to a first modification of the invention, the processing of the front surface consists in introducing or implanting doping impurities according to a predetermined profile, having particularly an important peak of concentration of impurities coinciding with each substructure, the consecutive thermal processing effecting a determination of the geometry of each substructure, an activation of the doping impurities and the intrinsic localized fields in the transition zones and an annealing of the implantation defects of dopant impurity ions across the thickness of the slice, of the wafer or of the chip region, with an effect limited to each embedded substructure (as to the effect of annealing).

In a preferable manner, the implantation energy of the dopant impurities utilized is of the order of several tens or several hundreds of KeV, particularly greater than about 150 KeV, and the implantation dosage used corresponds to an ion current of the order of several $\mu A. \text{ cm}^{-2}$ or of several fractions of $\mu A. \text{ cm}^{-2}$, particularly lower than 1 $\mu A. \text{ cm}^{-2}$.

According to a second modification of the invention, it can be provided during treatment of the forward surface to provide epitaxy or implantation to a given depth, of an active material, particularly Ge, followed if desired by a thermal treatment and by, if desired, a silicon epitaxy adapted to form the front superficial surface of the emitter, as well as active zones of generation by impact.

According to a third modification of the invention, the treatment of the forward surface consists in effecting an epitaxial increase of the emitter, with a doping profile of the δ-dopage type, comprising particularly at least one continuous flat layer very strongly doped, constituting the substructure or substructures embedded in the thickness of the emitter, then in subjecting said front surface to the implantation of ions of a neutral agent such as particularly hydrogen, silicon or the like and to a thermal treatment forming active zones by generation by impacts.

In this case, the role of the ions consists principally in bringing the necessary energy for the structural modification of a thin layer located in the emitter, adapted to form said at least one amorphous substructure, either by a destructive agent (hydrogen ions), or by a transformation of the crystalline structure (silicon ions).

After implantation of ions of a recited neutral agent, it is time to submit, within the scope of the present modification, particularly the emitter, to a thermal treatment adapted on the one hand to carry out a determinageometf the geometry of the substructure or substructures, an activation of doping impurities and an annealing of the implantation defects of the ions of neutral agent across the thickness of the slice, the wafer or the chip region, with a limited effect on the embedded substructure or substructures, and, on the other hand, to modify the crystallinity of the substructure or substructures at the zones of electrical transition and of constraint and the photoelectronic properties at the mesoscopic level by repositioning of the hetero-interfaces and the homo-interfaces L-H by an effect of recrystallization and rediffusion.

The epitaxial increase mentioned above can, for example, be carried out by means of an epitaxy of the molecular jet type (MBE).

According to a fourth embodiment of the invention, the starting slice or wafer, provided with a rear field (BSF) and having high quality crystallinity, is first provided with at least one amorphous layer having optical properties permitting the absorption of infrared radiation, then subjected to a conventional epitaxial increase of an emitter to at least two dopage levels: the weaker on the side of the P-N junction and the higher on the side of the front surface, these two regions of different dopage level being separated by at least one very thin embedded substructure or layer very strongly doped (dopage density about a hundred times higher than that of the emitter-δ-dopage at the level of the substructure).

So as to give the very thin layer at least one of the mentioned properties of generation permitting having a quantitative output substantially exceeding one, an implantation of hydrogen ions or a similar neutral agent should proceed under conditions of amorphization followed by the mentioned thermal treatment.

The thermal treatment mentioned several times above consists preferably of a conventional baking, known by those skilled in the art as CTA ("Classical Thermal Annealing"), carried on continuously or by successive or consecutive stages separated by intervals of observation, to a temperature below or equal to about 500° C., followed if desired by a rapid annealing, known to those in the art under the designation RTA ("Rapid Thermal Annealing"), at a temperature comprised between 500° C. and 1200° C., preferably about 1000° C., of only the front superficial surface region, producing a planification and a definitive crystalline and electrical formation of the interfaces of the flat embedded substructure or substructures in the emitter, leading to the formation, on the one hand, of two flat homo-interfaces L-H, which can be gradual or abrupt, located at the level of the limits of each substructure or understructure after the doping operation by epitaxy or implantation and, on the other hand, two hetero-interfacial planes delimiting each substructure or understructure after the crystalline modification and the formation of the transition zones due to annealing.

The duration of conventional annealing is preferably comprised, as a function of the quality of the material and the dimensions of the slice, wafer or chip region, in a time interval of about 1 to 30 minutes (as a function of the thermal conditions and thermal treatments or steps that may if desired follow). At the very moment the stopping of thermal treatment is detected by the variation of absorption of a luminous radiation of a given wavelength or of a range of given wavelengths, particularly in the field of red or near infrared, which does not permit controlling very precisely the activation of the Auger generation faculty (and if desired of absorption of infrared or a wide given range of frequencies) and, as the case may be, the optimization of this latter qualitatively or quantitatively.

Convention annealing can be carried out in a suitable oven and generally affects all the volume of the slice, wafer or chip region, whilst rapid annealing, which affects only a surface or embedded region of these latter, can be carried out by halogen lamps, a laser beam, an electron beam or the like and is followed by a quenching operation.

This conventional annealing, carried out at a temperature below or equal to about 500° C., preferably below or equal to about 400° C., permits relaxing the average strain which is a part of the strains damaging post-implantation and distributed across the volume of the wafer, slice or chip region that has been subjected to the passage of implantation ions.

The mentioned rapid annealing can take place at a temperature greater than or preferably equal to 500° C., which permits effecting a controlled partial recrystallization of the amorphous zone and a planification of the fields of constraint located at the level of the transmission zones of the hetero-interfaces α-Si/c-Si of the embedded substructure and due to the damage to the crystalline structure caused by the implantation of doping impurities, by self-implantation or by implantation of a neutral agent.

Conventional annealing and/or the rapid annealing described above, in which eventually a predetermined combination of these two types of annealing is combined, permits thus by controlling the kinetics of the epitaxy in solid phase, controlling precisely the constraint fields incorporated in the transition zones α-Si/c-Si (see FIG. 24).

The presence of the stress fields permits maintaining a significant quantity of divacancies in the mentioned transition zones, during the preceding thermal treatments, well beyond their normal recovery temperature (about 200° C.), which is to say suppression in the free crystalline or amorphous layer.

When the embedded substructure or substructures in the emitter is adapted to have an effective photovoltaic conversion activity simultaneously in the UV range and in the visible range, and in the infrared range, one should control the density of the divacancies present in the transition zone by using different parameters of the formation process for the substructure, namely, dosage implantation (greater than that for amorphization), thermal conditions of implantation (mean temperature and temperature gradient within the substrate) and the conditions of thermal annealing (conventional: about 500° C., rapid: greater than or equal to 500° C. or combined), with a view to bring about progressive planification and without discontinuities and with an epitaxy in solid phase maintaining a minimal thickness of the substructure to be effective for infrared absorption and increasing the effective optical range (about 20 to 100 nm of thickness) thanks to the optical confinement, relative to the substructure in question, and by modifying moreover the angle of incidence of the radiation reflected by the rear surface.

When the substructure embedded in the emitter is solely designed to have a photovoltaic conversion activity extended to the UW field and visible field (generation by impact), the dissymmetries present in the transition zones should be preserved to the maximum by providing a thermal treatment involving progressive planification and without discontinuities (uniformity of local mechanical constraints) and a marked thinning of the substructure (between twice the distance of penetration of the transition zone into the amorphous silicon and about 20 nm), which permits simultaneously limiting the undesirable action, of infrared radiation, of the divacancies present in the transition zones of the substructure in question.

It can also be provided to create several substructures distributed across the thickness of the emitter, of which each is provided with two combined fields (mechanical constraint field and electrical field), to reduce the mean range of the hot carriers or Auger (whose mechanism will be explained later) and which permit better exploitation by photovoltaic conversion of the surplus energy of said hot carriers (proximity or total or partial overlapping of the substructures relative to the regions of generation of the hot carriers) and therefore to increase the efficiency of the photovoltaic device.

In the case in which several substructures are present in the emitter, these can consist of one or several substructures active only in the UV and visible radiation (disposed nearer the surface of the emitter) and one or several substructures active also in UV and visible radiation and also in infrared radiation (these latter being disposed below the preceding substructure or substructures, farther away from the surface of the emitter).

The creation of several substructures in the emitter can be achieved by providing successively an implantation of an active material in a wafer or slice of monocrystalline silicon, followed by epitaxy in liquid or gaseous phase (for example an epitaxy of the type known as MOCVD).

Figure 1:
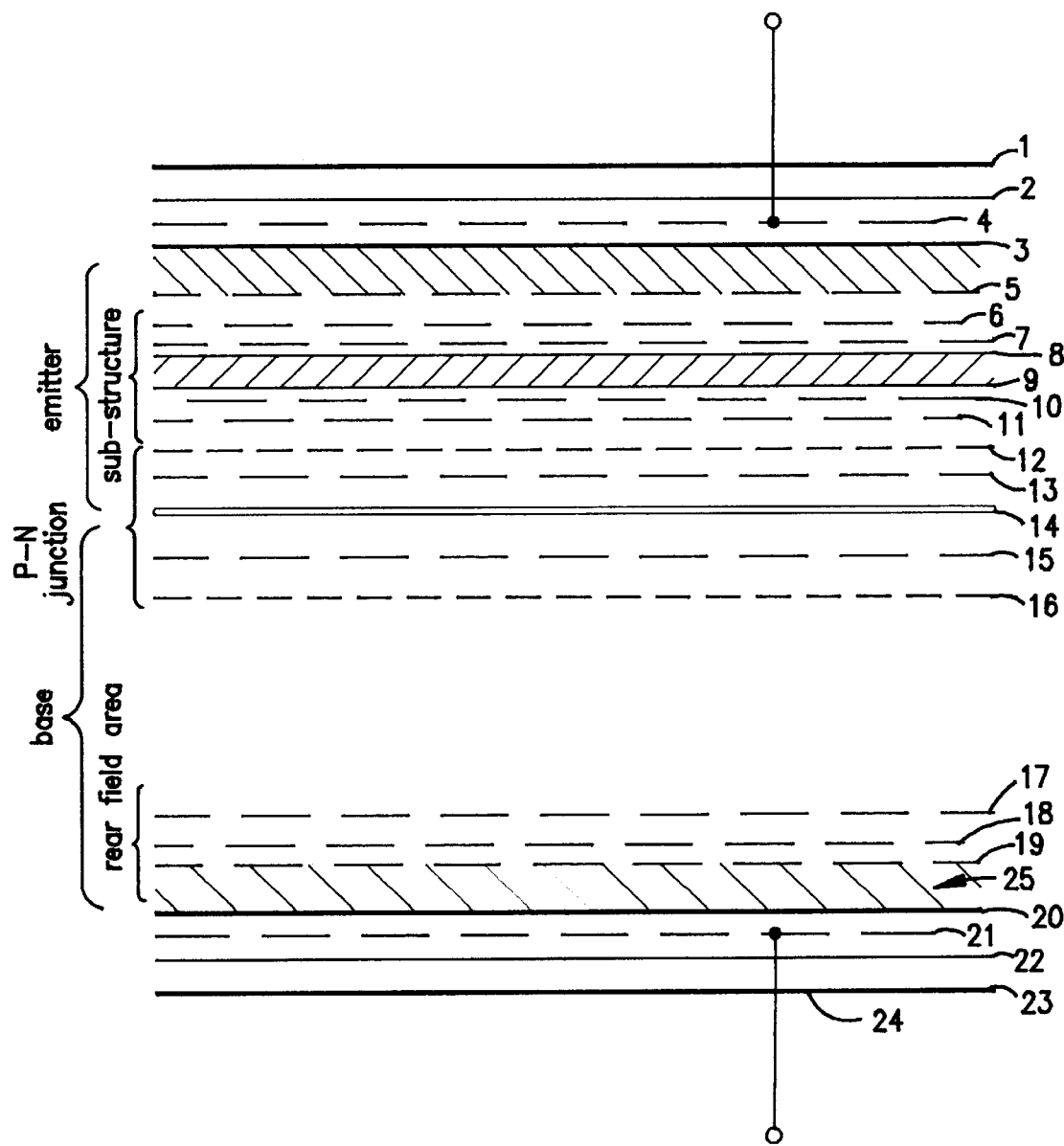
FIG. 1 is a schematic cross-sectional view of a photopile comprising, as active material, a slice or wafer of material obtained according to the process of the invention.

According to a characteristic of the invention shown in FIG. 1 of the accompanying drawings, the process can also consist in creating at least one amorphized supplemental substructure, very strongly doped (dopage type L-H), embedded in the emitter or in the base (in particular located at the rear surface of the base), having a limited thickness (between 20 and 400 nm) and delimited by two interfaces of the L-H type and by two crystalline hetero-interfaces, or by an interface of L-H type and by a crystalline hetero-interface, separated or merged, in the case of a substructure located at the rear surface of the base.

This supplemental substructure has an increased activity for the photovoltaic conversion of infrared radiation thanks to maximum suppression of the divacancies during thermal treatment fixing the dimensional, geometric and morphological parameters of the substructure and of its interfaces.

As shown in FIG. 1 of the accompanying drawings, this supplemental substructure can for example be obtained by creating a rear field in a wafer or slice of monocrystalline silicon doped with boron ($5 \times 10^{14}$ cm$^{-3}$ to $5 \times 10^{17}$ cm$^{-3}$), by diffusion of aluminum, by providing an auto-implantation of silicon with relatively high doses ($>10^{15}$ cm$^{-3}$) to obtain the amorphization of a layer (thickness: 20 to 400 nm) across the thickness of the substructure and, finally, by providing a thermal treatment of the wafer or slice (conventional annealing, followed by rapid annealing) to achieve a planification of the interfaces of said substructure and maximum suppression of the activity of the divacancies (by applying a thermal energy 5 to 10 times greater than that used for the active emitter substructures in UV and visible light).

The energy balance of this thermal cycle carried out after auto-implantation is as a result 5 to 10 times greater than that used for UV and visible substructures, thereby leaving a working margin for suppression of divacancies, despite the mechanical constraints present, while preserving the dimensions and the geometric parameters of the amorphized substructure.

As a modification, this supplemental substructure could also be obtained by providing a highly dosed implantation ($>10^{15}$ cm$^{-3}$) with a doping impurity forming the rear field (example: Al) and the hetero-interface of L-H type and by then providing a thermal treatment to obtain planification of the interfaces of the transition zones of said substructure and a maximum suppression of the divacancies.

The thermal treatment for the supplemental substructure mentioned above consists preferably in a conventional annealing at a temperature below or equal to about 500° C. of the assembly of the slice, wafer or chip region, followed by rapid annealing at a temperature greater than or equal to 500° C. of the superficial region of the rear surface, comprising particularly said supplemental substructure.

However, numerous other processes for production of this supplemental substructure can be imagined by one of skill in the art from a reading of the present text.

In practice, this supplemental substructure will be provided first, not being influenced by the consecutive thermal treatments applied during formation of the substructures embedded in the emitter and active in the visible and UV ranges thanks to generation by impact.

According to one characteristic of the invention, the mentioned thermal treatments are preferably followed by a low temperature passivation of the front surface of the slice, wafer or chip region adapted to be exposed to luminous radiation, particularly by using chemical deposition in gaseous phase assisted by low temperature plasma (PECVD) or evaporation of SiO in a rarified oxygen atmosphere of the order of about $10^{-4}$ Torr, such as is particularly described by C. Leguijt et al. (7th International Photovoltaic Science and Engineering Conference, Nagoya, Japan, Nov. 22–26, 1993), or an organic solvent to avoid as much as possible any risk of deterioration or destruction of the substructure.

This passivation operation of the front superficial surface of the emitter gives rise to a reduction of the speed of recombination in the passivated zone and permits, in connection with the creation of the potential barrier at the level of the substructure or substructures resulting from the insertion of the L-H interfaces, for the slice, wafer or chip region to have an effective confinement of minority carriers in the emitter layer or layers located between the front surface and the least embedded substructure, and between two consecutive substructures.

There is thus formed one or more reservoirs of minority carriers of optimum thickness, as a function particularly of the initial doping, comprised between about 50 and 700 nm, according to the depth or depths to which the substructure or substructures are present in the emitter.

According to another characteristic of the invention, and so as to elongate the optical train of the photonic radiations that can be absorbed by said substructure or substructures absorbing infrared so as to increase their probability of absorption by the latter and hence the efficacy of photogeneration of electron-hole pairs (intrinsic quantitative output), there can be provided, by superficial shaping and/or coating by a layer of predetermined material, an internal or external optical confinement throughout the thickness of said slice, wafer or chip region, particularly for luminous red and infrared radiation.

Thus, the optical confinement to the level of the substructure, carried out by supplemental treatment at least of the front surface and due to a change of the refractive index at the hetero-interfaces marking the limits between the monocrystalline structure of the emitter and the modified crystalline or amorphous structure, is completed by an optical confinement at the external interfaces (surfaces of the front and rear surfaces of the slice, wafer or chip region), a treatment of the rear surface not being necessary except when the latter has no continuous electrical contact surface covering the same, forming a reflecting surface.

The addition of such properties of optical confinement to a slice, wafer or chip zone, is particularly described in the publications: E. Yablonovitch, G. D. Cody, *IEEE Trans. Electron. Dev. ED*-29 (1982) 300 and M. A. Green, "High Efficiency Silicon Solar Cells", Trans. Tech. Publications, 1987 and B. L. Sopori and T. Marschall, "23rd IEEE Phot. Spec. Conf.", May 10–14, 1993, p. 127–132.

According to a characteristic of the invention, the starting silicon material, forming the slice, wafer or chip region which will be implanted with doping impurities or which will serve as a substrate for a possible epitaxial increase of the emitter, consists of monocrystalline or polycrystalline silicon (with large crystals), with a concentration of doping impurities comprised between $5\times10^{14}$ cm$^{-3}$ and $5\times10^{17}$ cm$^{-3}$ said material comprising no undesired impurities which can be activated by the implantation energy and the thermal treatment and having auto-recovery properties of the crystalline structure during implantation and recovery of the crystalline structure by conventional annealing at low temperature, lower than or equal to 500° C.

The final structure of the slice, wafer or chip region is of the emitter/base/region type of rear field with either, for initial doping p, respective dopings $n^+/p/p^+$, the doping impurities implanted being selected from the group comprised by phosphorus, antimony and arsenic (particularly for the substructure or substructures embedded in the emitter), or, for initial doping n, respective dopings $p^+/n/n^+$, the doping impurities being selected from the group comprised by aluminum, boron, gallium and indium.

The rear field preferably has a doping gradient the most abrupt possible to limit the thickness of the electronic transition zone and above all the doping level $p^+$ (or $n^+$ as the case may be), in such a manner that the speed of superficial recombination of the rear surface may be easily controlled.

Similarly, the rear surface can be the object of a passivation, at low temperature, particularly when the zones or points of electrical contact are not continuous (contact in the form of a continuous metallic cladding) and are present for example in the form of a grill.

According to a preferred embodiment of the invention, the emitter of said slice, wafer or chip region has a thickness less than or equal to 1 $\mu$m and the P-N junction and the L-H junction forming the rear field have a depth less than 1 $\mu$m.

According to a preferred characteristic of the invention, the final thickness of the active zone or zones of the emitter and/or of the base is less than 1 $\mu$m and the P-N junction and the L-H junction forming the rear field have a depth less than 1 $\mu$m. Similarly, the thickness of the substructure at least present in the emitter is comprised between 20 and 100 nm, said substructure at least present being located at a distance comprised between 50 and 700 nm from the front surface of the slice, wafer or chip region and having a high selective conductivity of majority carriers thanks to its very high dopage, higher than about $10^{19}$ cm$^{-3}$, preferably 100 times greater than the dopage of the emitter which combined with its very low thickness renders said substructure totally transparent to said majority carriers.

The thickness of the substructure which may be disposed in the base is as to its comprised between 20 and 400 nm, said substructure being located preferably at the rear surface (or at a certain distance from the rear surface) and having a high selective conductivity for the majority carriers thanks to its very high doping, higher than about $10^{19}$ cm$^{-3}$, preferably abrupt and at least 100 times greater than the doping of the base, which renders said substructure, in combination with its very small thickness, totally transparent for said majority carriers.

As a function of the type of solar cells or photopiles envisaged, namely thick or thin, the slice or wafer of silicon can have, either a total thickness comprised between 120 $\mu$m and about 300 $\mu$m, or an initial thickness, before a possible epitaxial increase, comprised between 3 $\mu$m and 120 $\mu$m and is counter-cemented on a rigid support, for example on a thin plate of stainless steel.

Moreover, it should be noted that the relative positionings of the homo-interfaces L-H and of the hetero-interfaces relative to each other can be influenced, during implantation of neutral agent ions or doping impurities, by controlling the deposit of energy in the thickness of the substructure, and during thermal treatments consecutive to said implantations.

By way of example, there will now be given two practical examples of the two modifications of the process of production according to the invention.

Figure 2:
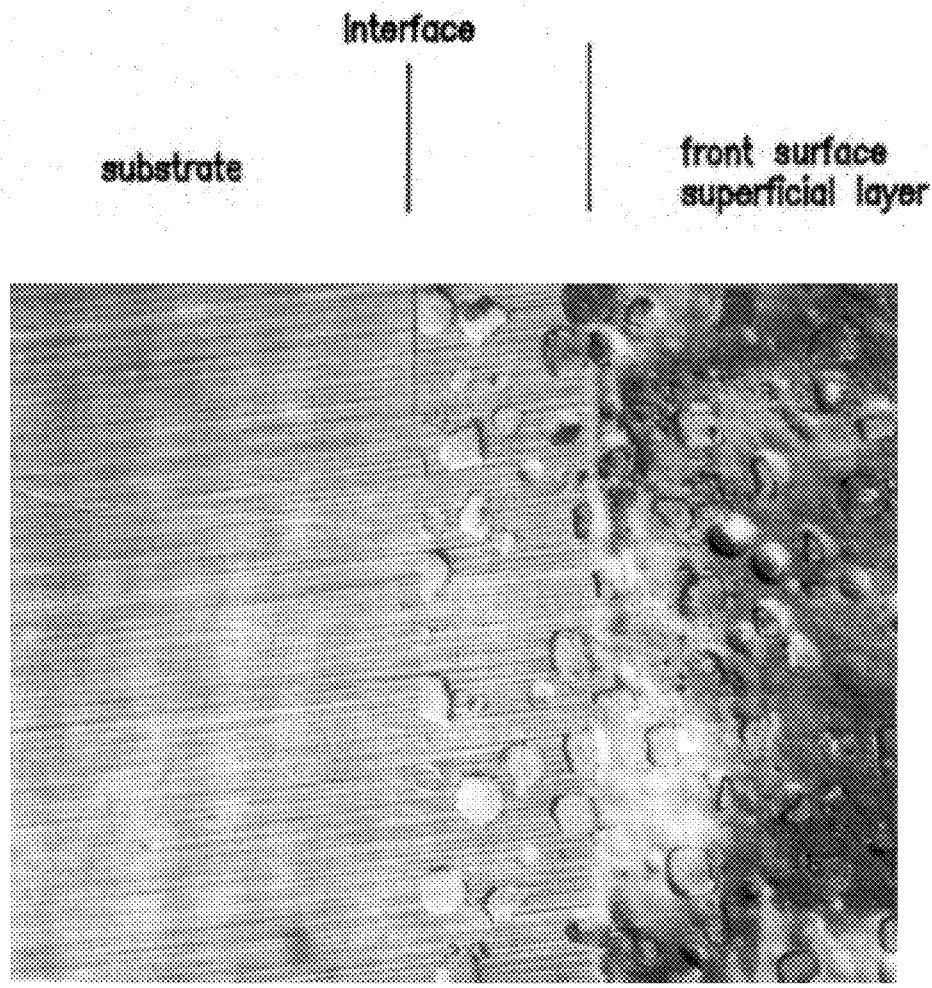
FIG. 2 is a cross-sectional view of a specimen of implanted hydrogen through a bevel of tgx=0.01187 and with an enlargement of 180 times.
Figure 2:
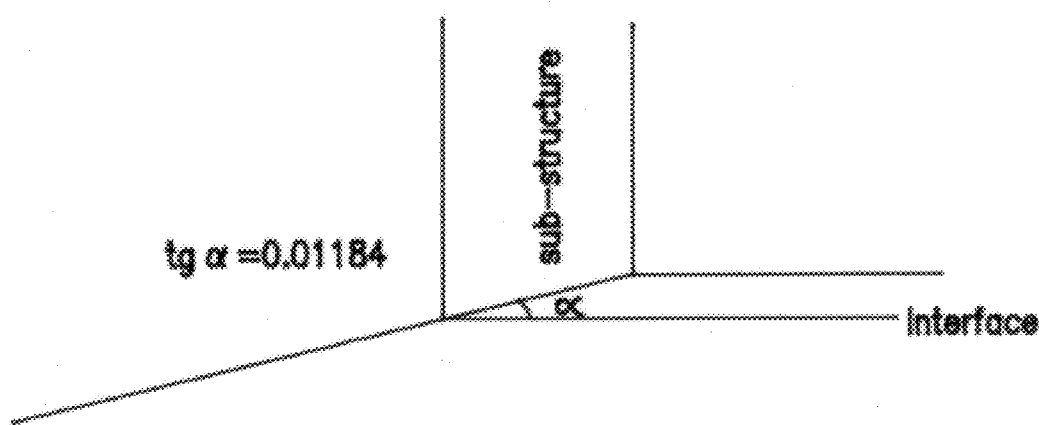

In a specimen (wafer) of monocrystalline silicon doped with boron ions (concentration $5\times10^{14}$ to $5\times10^{17}$ cm$^{-3}$), there was conducted an implantation of hydrogen ions (field: 160 KeV, dose: $3\times10^{16}$ cm$^{-2}$, with control of thermal conditions of the substrate), followed by a thermal treatment as mentioned above, so as to form a fixed substructure embedded in the layer forming the emitter and formed of highly modified silicon, constituting a complex interface because of the very high density of impurities present (FIG. 2).

Thus, the thermal treatment gives rise to a recovery effect about the substructure or buried layer of faults, coinciding with a very high concentration of impurities in the region situated within said substructure.

The diffusion of impurities has been obtained by conventional rapid and combined annealing of the specimen and has permitted the formation of a doping peak at a depth of 1.09 $\mu$m.

Figure 3:
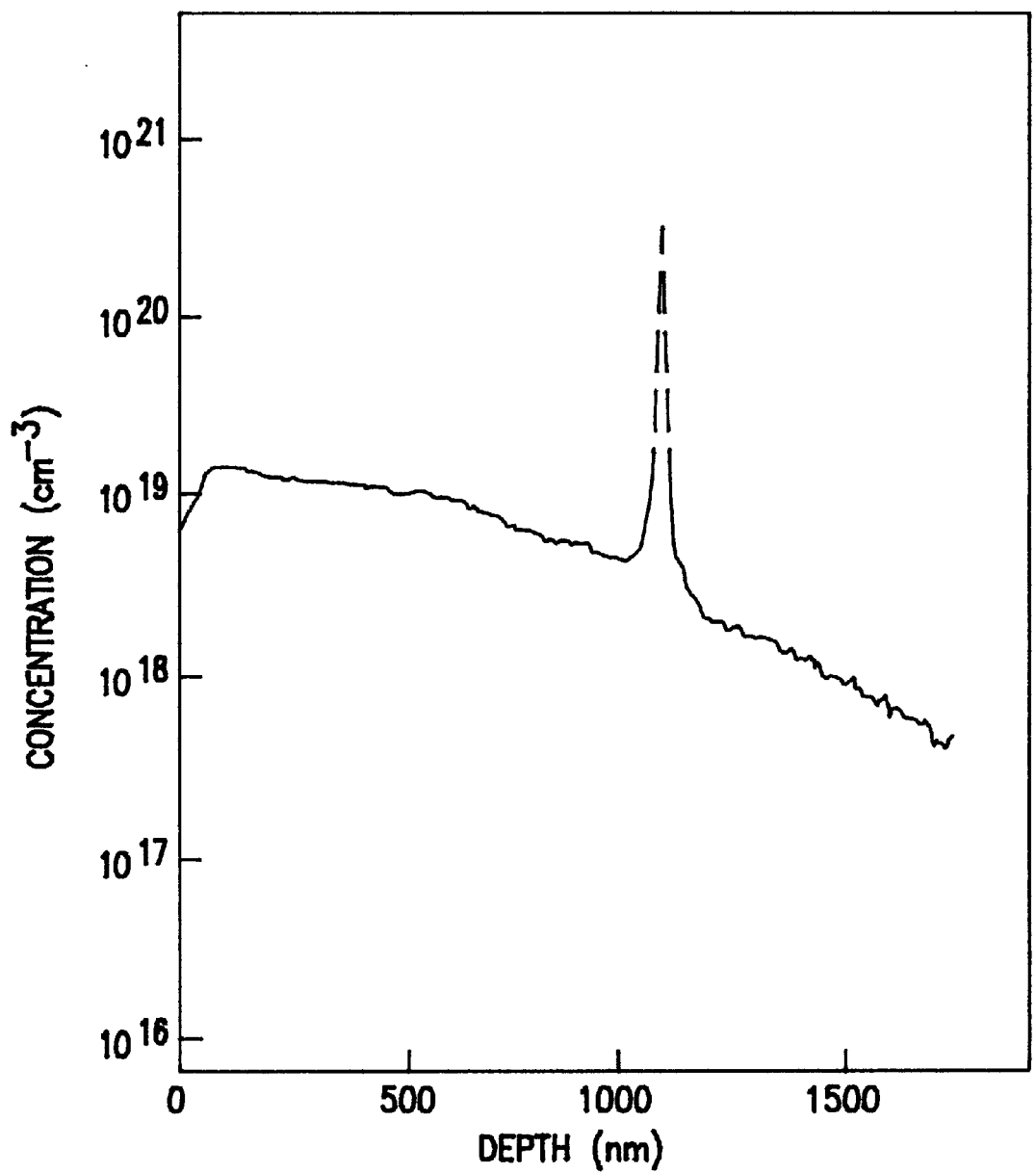
FIG. 3 is a curve showing the doping profile of the impurities measured in the specimen of FIG. 2 according to the secondary ion mass spectroscopic method, called SIMS.
Figure 4:
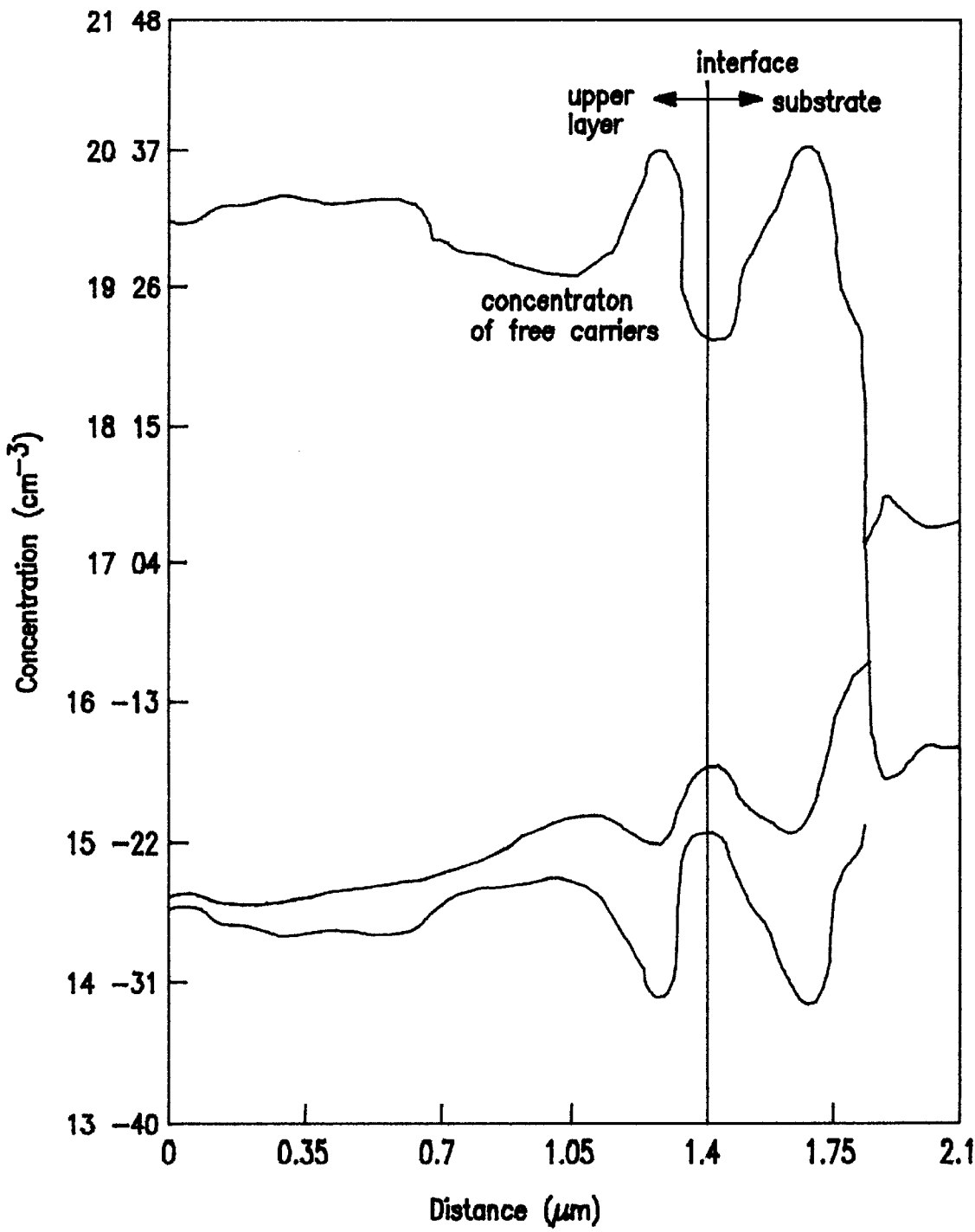
FIG. 4 is a curve showing the profile of distributed resistance through a cavity of a specimen shown in FIG. 2.

FIGS. 3 and 4 show, by way of illustration, the profiles of the resulting doping impurities measured by means of two complementary measurement methods, namely, on the one hand, the so-called SIMS method (FIG. 3) and on the other hand the distributed resistance method (FIG. 4), this through a cavity.

FIGS. 3 shows well a doping peak indicating the existence and the situation of the substructure and the spring of FIG. 4 below the limit of solubility of boron without silicon all the impurities in such a peak are ionized.

In reality, the local concentration of active impurities in the continuous substructure is substantially higher than the maximum value indicated in FIGS. 3 and 4, the mode of determination by integration of the two methods described not permitting a sufficient resolution to show it.

The dotted line curve in FIG. 3 indicates approximately the shape of such a doping peak.

The electrically active impurities are locked between two interfaces L-H which are relatively sharp and give rise to local increase of the conductivity in the continuous substructure, which has been experimentally observed.

The L-H interfaces mentioned above create an intrinsic electric field at the ends of the substructure. When the mentioned field is sufficient intense the mean path of the minority carriers photogenerated by infrared absorption is equal to only a quarter of the thickness of said substructure. The transit time is thus reduced, the duration of the effective life of said carriers increases and their extraction from said sublayer is more effective.

Moreover, it has been noted that for a photovoltaic cell, having infrared absorption properties, by means of a strongly doped continuous nanometric substructure (δ-dopage) as described above, the supplemental addition of an intrinsic field generated by two L-H homo-interfaces permits decreasing by at least one order of magnitude the values of the saturation current (hence the obscurity characteristics of the type of solar cells HLE—F. A. Lindholm et al., *XIIIth IEEE Photovoltaic Specialists Conference*, Jun. 5–8, 1978, Washington, D.C., U.S.A., p. 1300–1305), the voltage $V_{OC}$, being moreover practically independent of the position of the substructure in the emitter.

Moreover, the continuous substructure of modified material creates a second barrier of potential (more than the P-N junction) which has the faculty of increasing the voltage in open circuit by an increase of the concentrations of the photogenerated carriers.

According to a second practical example of embodiment of the invention, a substructure absorbing infrared has been formed simultaneously with the emitter (doping profile) by implanting phosphorus ions with a field of 180 KeV in a monocrystalline silicon substrate doped p, then by applying a thermal treatment of the type mentioned above.

The mentioned process has permitted the formation on the one hand of a continuous strongly doped substructure, of a thickness of 70 nm and located at a depth of 97.5 nm from the surface of the front surface of the sample, and, on the other hand, of a P-N junction with a depth of 0.5 $\mu$m.

The emitter layer comprises between the front surface and the limit plane (crystalline interface) the nearest the substructure, after thermal treatment, its monocrystalline structure, by recovery of the defects created during implantation, and constitutes the active zone of absorption and photoconversion of the luminous radiation of short wavelength.

Figure 5:
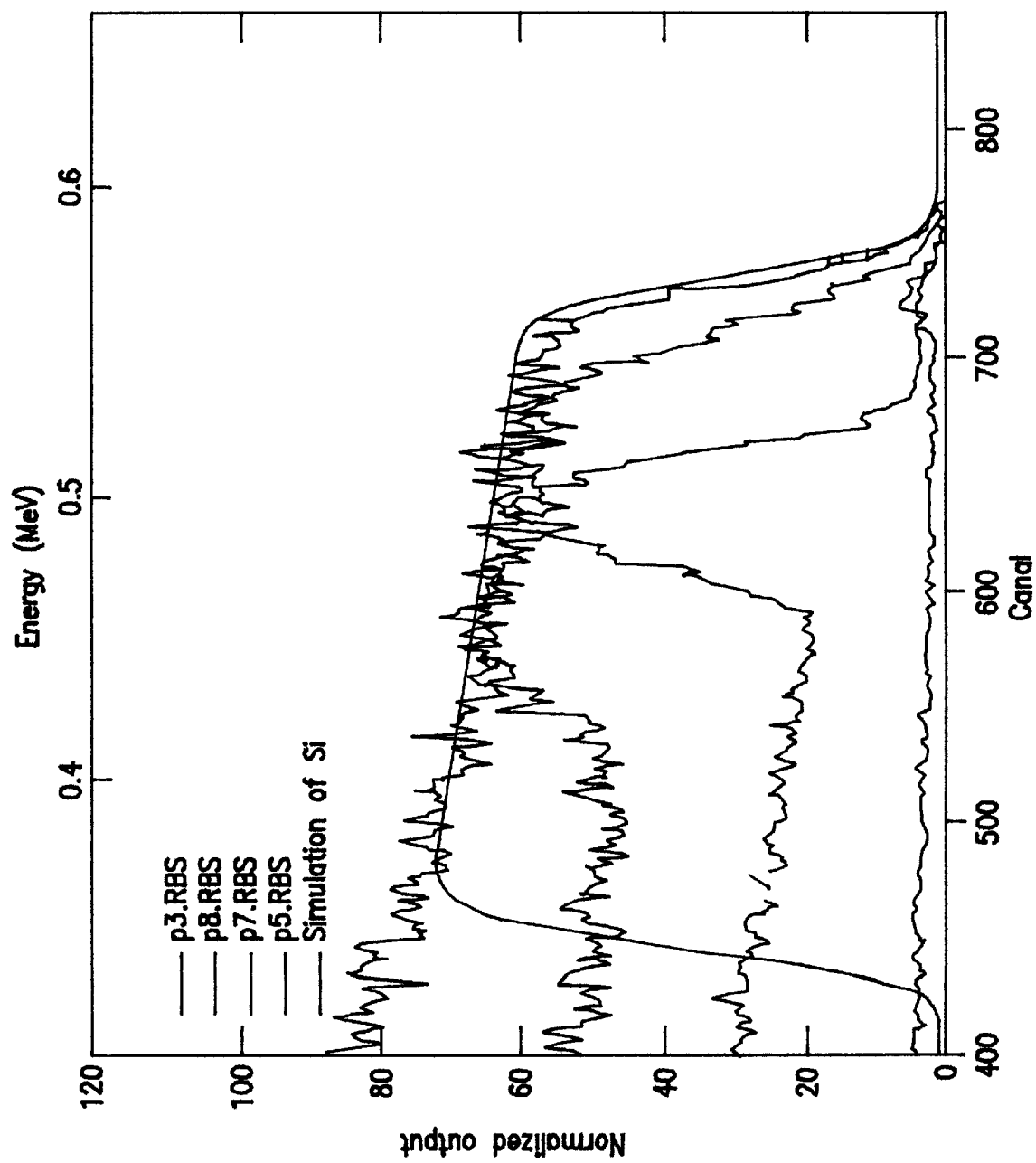
FIG. 5 shows the structural composition of an emitter implanted with phosphorus ions according to a modification of the process according to the invention measured by the method called retrodiffusion by Rutherford (RBS)

FIG. 5 of the accompanying drawings shows the structural composition of the emitter thus formed, permitting restoring the complex interface constituted by the strongly doped substructure whose impurities are practically all ionized.

Figure 6:
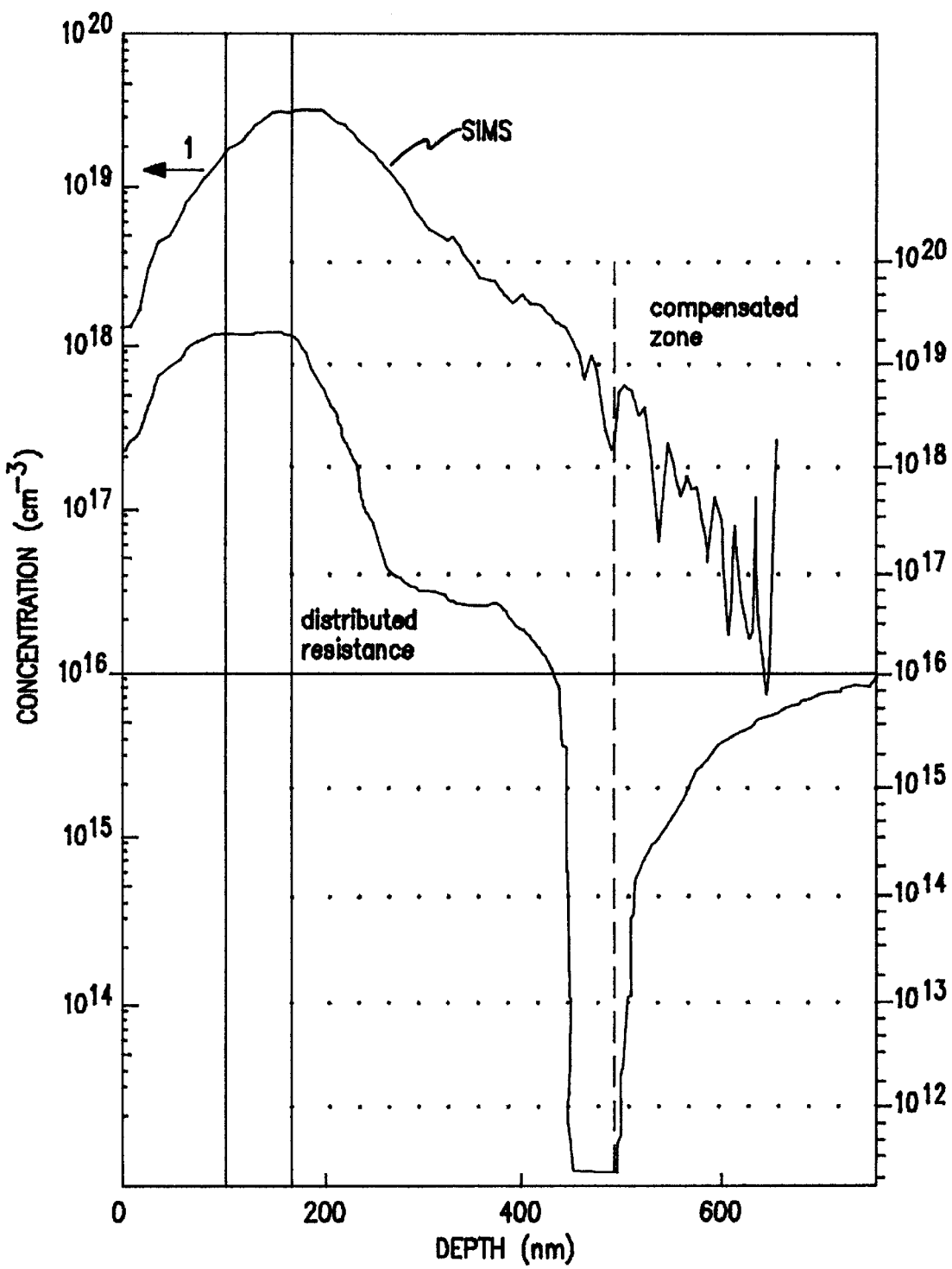
FIG. 6 shows curves of the doping profile and of the active doping profile corresponding to the methods of SIMS and of spreading resistance of a specimen having an emitter formed by implantation of phosphorus ions, identical to that considered in FIG. 5.

The doping profile (profile of atomic impurities) and the active doping profile have been measured respectively by the SIMS method and the method of "spreading resistance" (FIG. 6) on a specimen implanted as above, but in the channeled mode, which permits better visualization of the activation effect of the impurities as a function of the occupation of the substituent and interstitial sites by the phosphorus atoms. By way of measurement, there is also shown the modified/amorphized substructure and the P-N junction. It will be seen that the channeling effect is very well shown in the results obtained by the so-called "spreading resistance" method. A small fraction of inactivated impurities seems to manifest itself below the substructure at a depth of 300 nm and they seem to occupy the interstitial sites (see FIG. 8).

Figure 7:
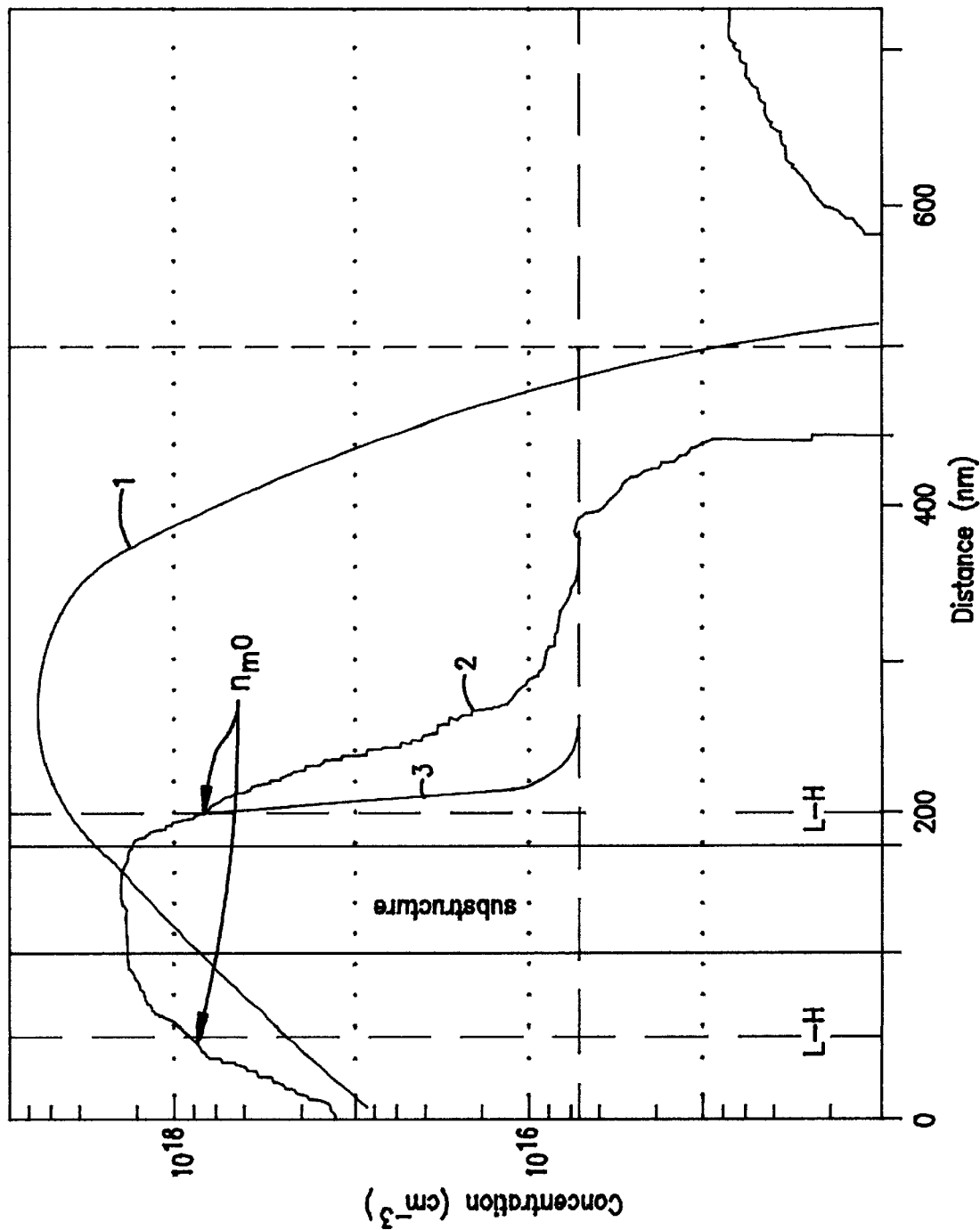
FIG. 7 shows curves of the distribution of impurities or of free carriers in an emitter formed by implantation of phosphorus ions, identical to that of FIG. 6 and with the visualization of two crystalline hetero-interfaces and two homo-interfaces L-H.

FIG. 7 shows by comparison the distributions: theoretical random implantation of phosphorus (1) , experimental of the free carriers by channel implantation (2-profile of spreading resistance) and theoretical of the free carriers about an abrupt L-H homo-interface (3), said L-H interfaces (front and rear) having been positioned from the flexure point corresponding to the concentration $n_{mo}$ of the distribution curves of the free carriers.

Figure 8:
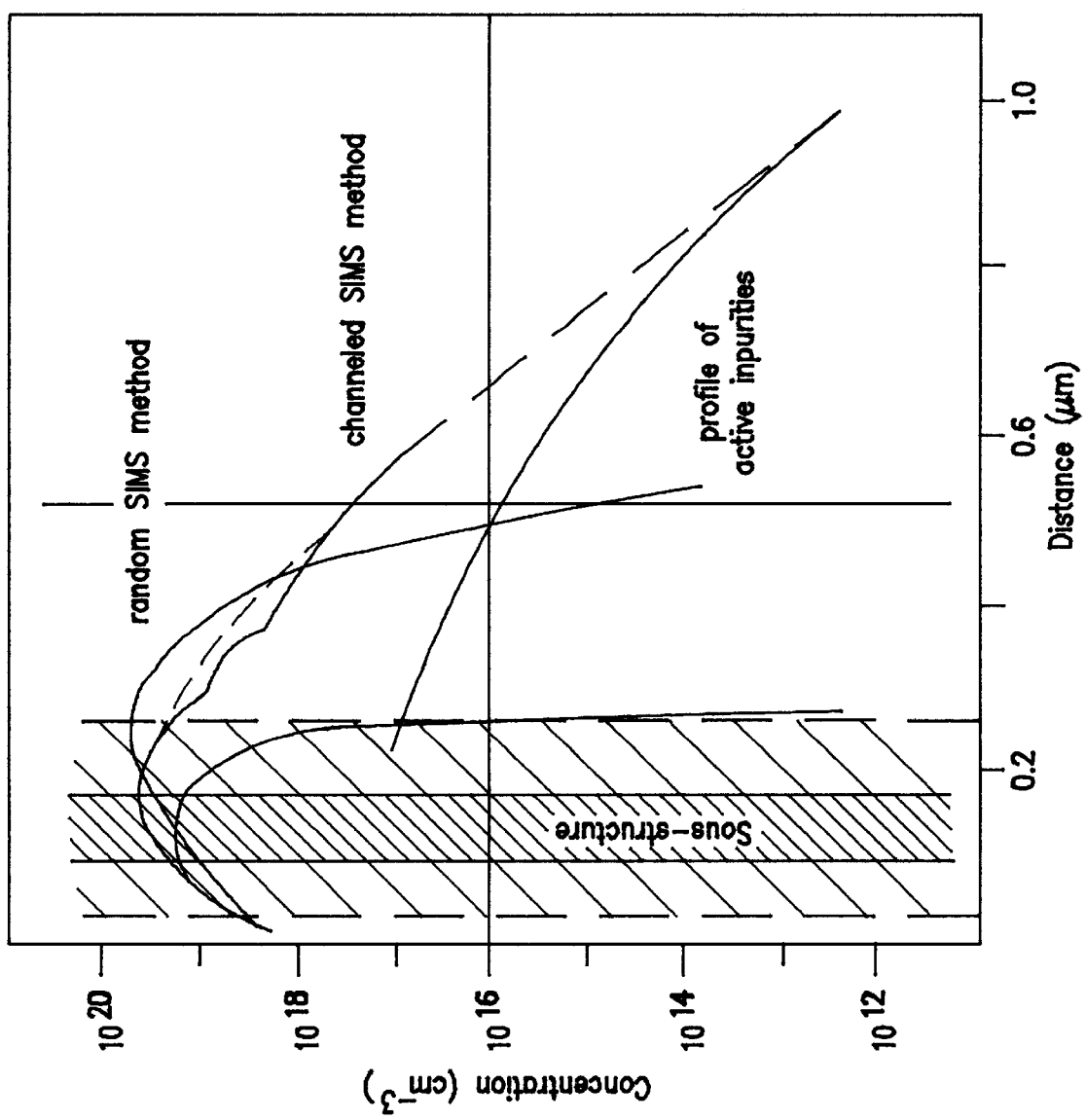
FIG. 8 shows the curves of the experimental implantation profiles obtained by methods SIMS and spreading resistance and of theoretical implantation.

FIG. 8 shows by way of comparison the distributions in a specimen of implanted phosphorus, by channeling: experimental profile by the so-called SIMS method (1), two experimental profiles of active impurities by the spreading resistance method (2) and theoretical random implantation profile of the phosphorus (3).

This figure also shows the evolution of the substructure during the thermal treatment (thinning of the zone comprised between the interrupted vertical lines/to give the zone comprised between the full vertical lines).

The optical properties (reflection, transmission, absorption) have also been measured on specimens obtained by means of the recited process and provided with an absorbent substructure formed by implantation of phosphorus ions and thermal treatment.

Figure 9:
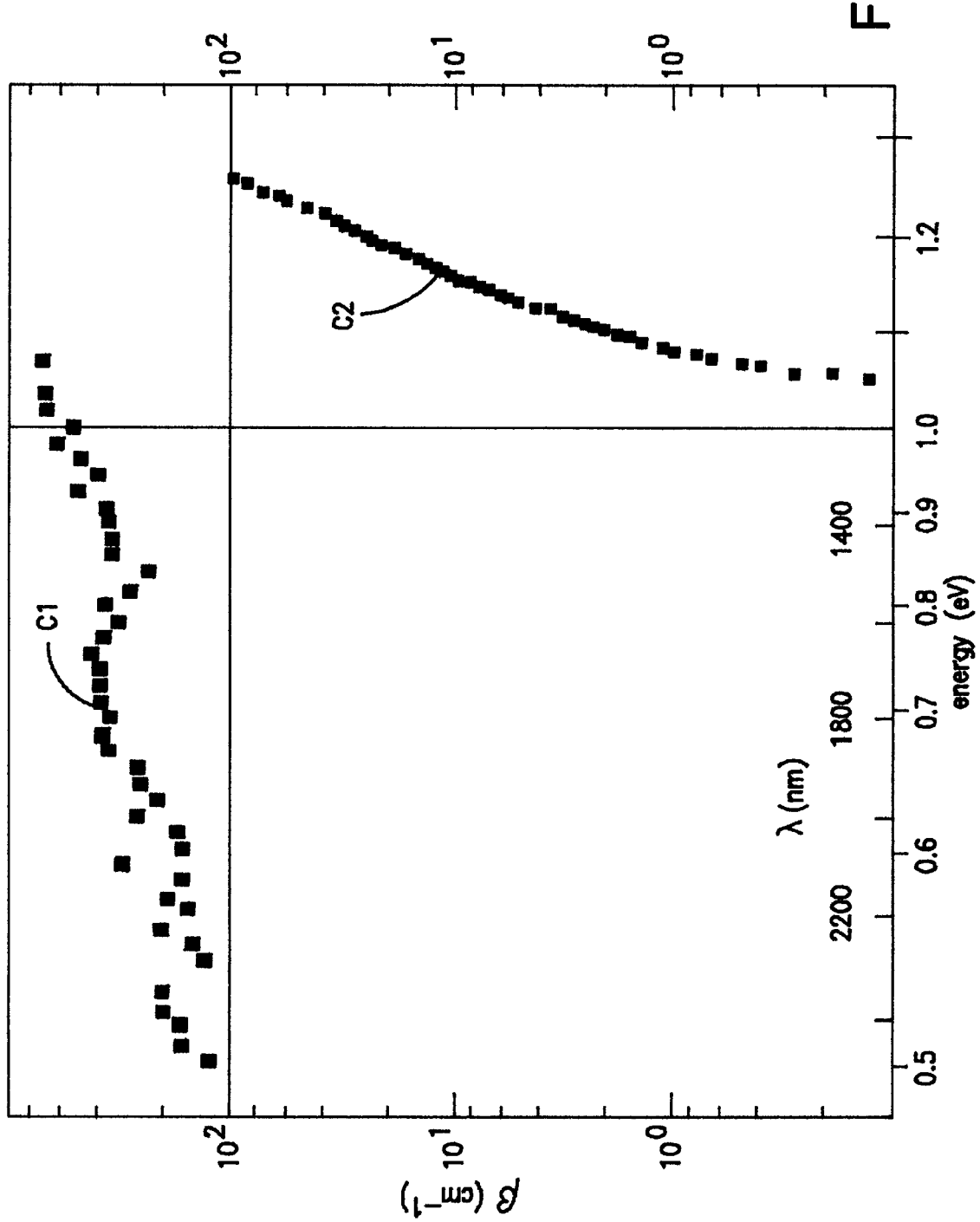
FIG. 9 shows in the form of curves, the optical absorption of a specimen provided with an absorbent substructure and formed by implantation of phosphorus ions and a specimen of normal monocrystalline silicon.

FIG. 9 shows the spectral distribution of optical absorption (absorption below gap as a function of the wavelength) measured spectroscopically by photothermal deflection (PDS) on a specimen obtained according to the process of the invention, which is to say substructures strongly doped and rear field (C1), and on a specimen of monocrystalline silicon (C2).

This figure shows clearly the enlargement of the optical absorption spectrum for the emitter comprising the substructure according to the invention, to a wavelength $\lambda$=2500 nm at a constant level higher than at least $10^2$ cm$^{-1}$.

The measurements of absorption have been completed by measurements of transmission and reflection carried out on the same specimens for wavelengths $\lambda$ such as 800 nm<$\lambda$<3200 nm.

Figure 10A:
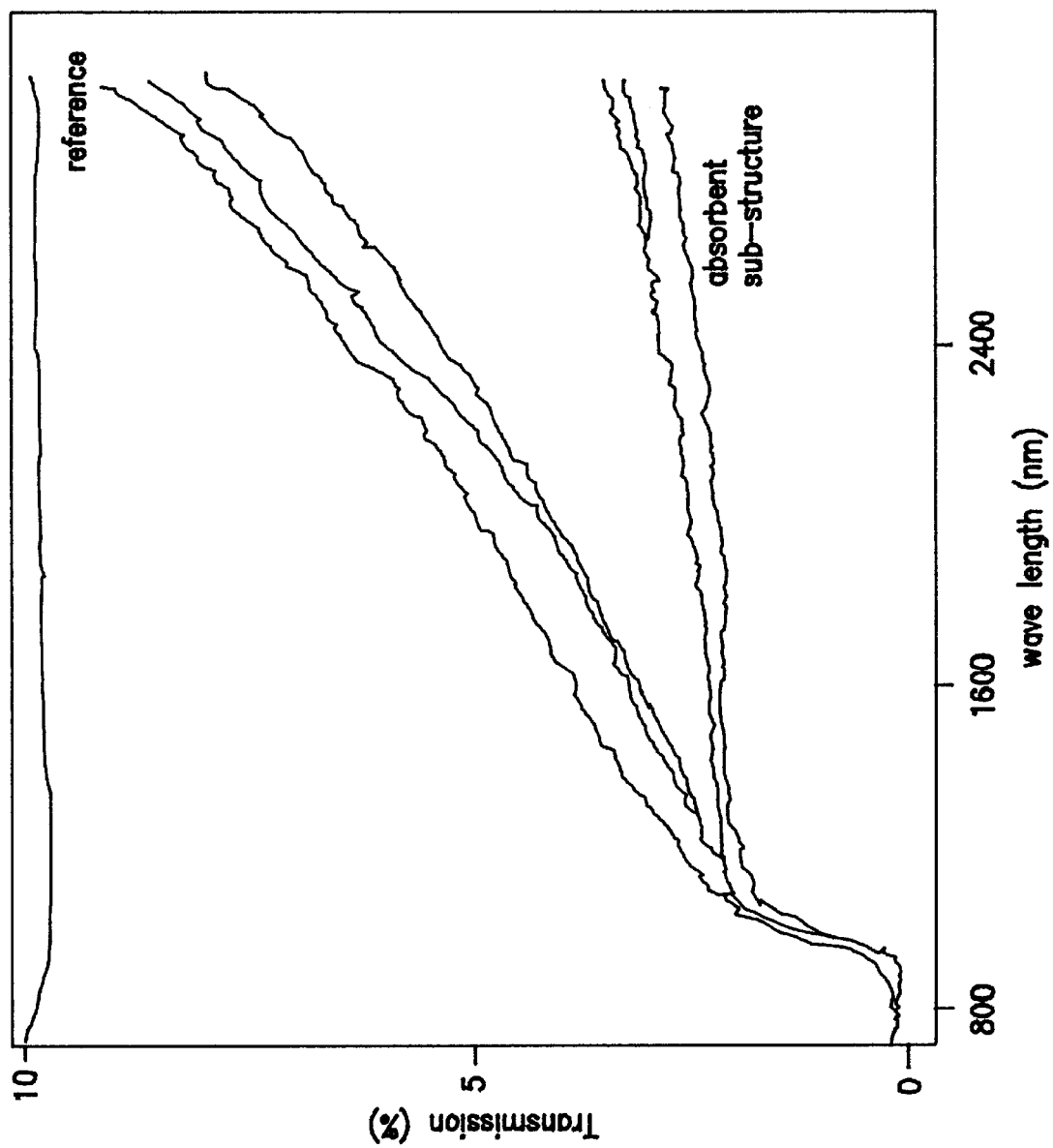
FIG. 10A shows in the form of curves, the rear transmission surface of the specimens considered in FIG. 9.

FIG. 10A shows the very great difference in transmission which, from about 1200 nm, increases toward the long wavelength, in favor of the emitter obtained according to the process of the invention.

Figure 10B:
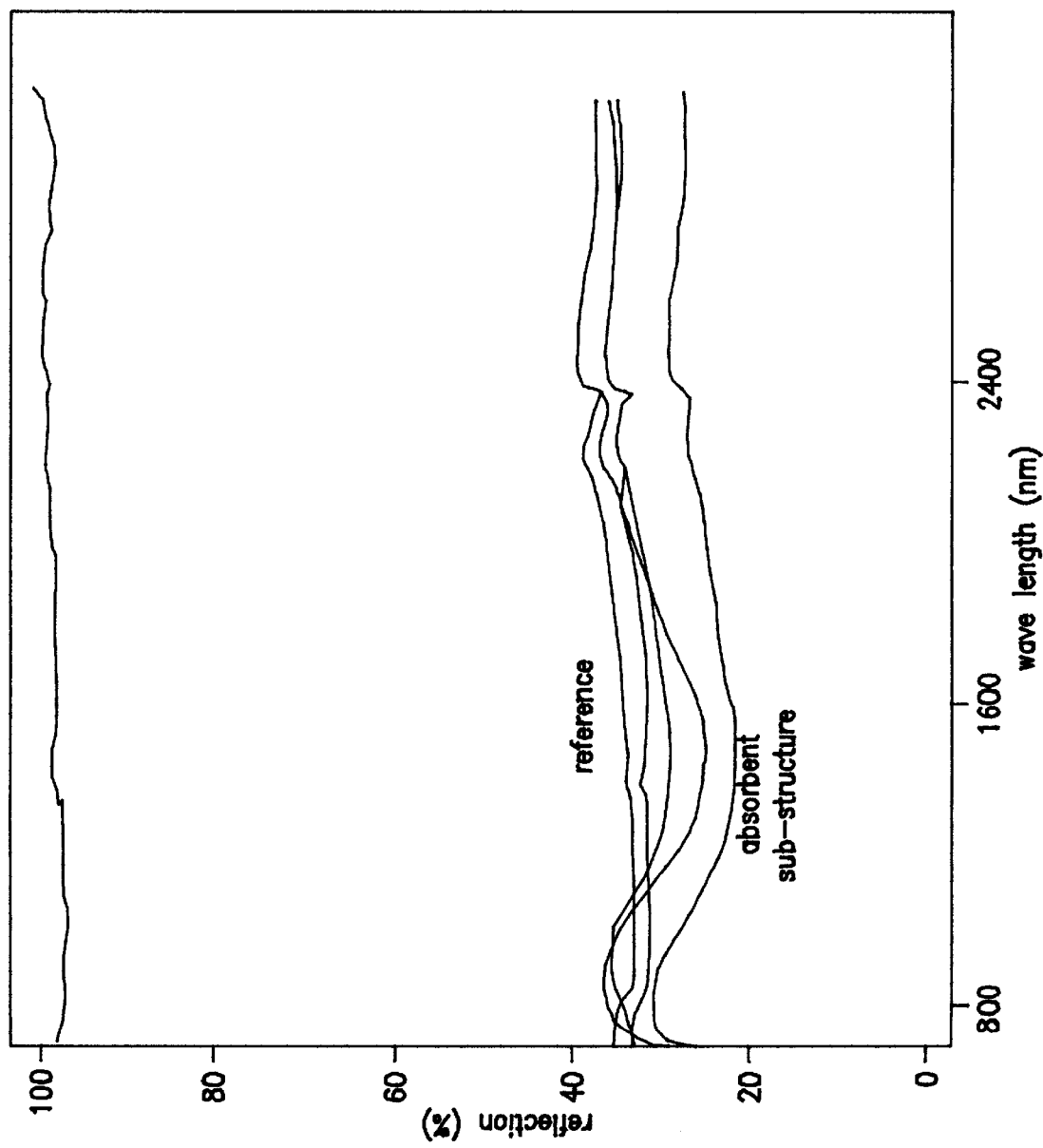
FIG. 10B shows in the form of curves, the front reflection surface of the specimens considered in FIG. 9.

It has also been found that the emitter comprising a modified absorbent substructure has a reflection different from that of the monocrystalline silicon spectrum (see FIG. 10B).

In a first spectral range (840<$\lambda$<1160 nm), the specimen with the substructure reflected more, whilst in a second spectral range (1160<$\lambda$<1960 nm), it reflected less.

The reflection is not linear as a function of the wavelength and the difference between the two end values of reflection is 12%, which is about ten times greater than that of the reference spectrum of monocrystalline silicon.

The least reflection in the higher range of wavelengths can be easily explained by substantial absorption of these radiations by the substructure.

There have also been carried out photocurrent measures with a photovoltaic device according to the invention with a very thin substructure (d=70 nm) having two hetero-interfaces L-H and two homo-interfaces L-H at the level of its limits (without optical confinement). Two geometric factors characterize in this case the photovoltaic device mentioned above with $\delta$-dopage and $\delta$ rear field: a narrower structural zone (d=70 nm) of modified semiconductor material and a more extended electrical zone (d=150 nm) with a higher dopage density.

Such a photovoltaic device according to the invention permits observing the changes of the photocurrent in comparison with a conventional reference cell with a back field (of 250 $\mu$m) having good output of about 16%.

FIGS. 11A and 11B show photocurrents corresponding particularly to the infrared absorption measured simultaneously for the device or photovoltaic specimen having at least one substructure according to the invention (C1) and the (Reference) cell mentioned above.

It can be observed on these figures that the difference of absorption and of photocurrent generation is very nicely visible for $\lambda$, 1800 nm in the two cases of lamps with different spectra. The ranges of characteristic infrared photocurrents correspond to those detected during optical absorption measurements except as concerns the gap in activity of the divacancies about around 1800 nm (see FIG. 9). The substantial drop in photocurrent toward the longer wavelengths is not due to a lesser absorption of the device according to the invention, but in the first instance to a notable increase of the activity of the divacancies (excitation of the molecular type with no photogeneration), then to a particular drop namely an annulment of the energy supplied by the lamps for these wavelengths.

The invention also has for its object a slice or wafer of photovoltaic material that can absorb, more photonic fundamental radiation of silicon, the red and infrared radiations and can generate by impact extra carriers thanks to the surplus of energy of the UV and visible photons, consisting essentially in monocrystalline silicon or large grain polycrystalline silicon and comprising a layer forming an emitter at its front face or adapted to be exposed, a rear field structure at the level of its unexposed surface and a P-N junction within the thickness of said slice or wafer, characterized in that it comprises moreover at least one continuous and strongly doped substructure of amorphized or modified silicon, embedded within the thickness of the emitter or of the base and of very small thickness, said substructure having a resistivity lower than that of the starting material and being delimited each by crystalline interfaces and electrical planes, particularly by two flat crystalline heterointerfaces and two homo-interfaces L-H, overlapping or not the hetero-interfaces and corresponding to the limits of the substructure in question after implantation of the doping impurities and before formative annealing, said substructure or substructures being moreover provided with intrinsic opposite electric fields formed at each homo-interface L-H promoting the extraction of the minority carriers photogenerated in said substructure.

According to a first modification of the invention, the slice or wafer can comprise but a single substructure embedded in the emitter and adapted to have a photovoltaic conversion activity which will be effective simultaneously within the UV and visible region and in the infrared region.

According to a second modification of the invention, the slice or wafer can comprise several substructures distributed across the thickness of the emitter, of which each is provided with two combined fields, namely a mechanical constraint field and an electrical field, one at least of said substructures having an increased or extended activity for a photovoltaic conversion within the range of UV and visible light.

The substructure or substructures embedded in the emitter or in principle adapted to generate by impact (which will correspond to a quantitative output exceeding unity) and the substructure or substructures embedded in the base is or are adapted to extend the infrared absorption, said base substructure or substructures having a resistivity substantially less than that of the silicon starting material and being delimited by at least one crystalline and flat electric interface, particularly by a crystalline hetero-interface and a homo-interface L-H combined or not with the hetero-interface.

These interfaces correspond to the limit of the substructure after formation of the rear field zone by implantation of doping impurities or by diffusion of doping impurities according to an implantation of a neutral agent or of an auto-implantation amorphism.

The mentioned electrical interface or interfaces constitute an intrinsic electric field promoting the extraction of the minority carriers photogenerated in said substructure and forming a screen for the minority carriers of the base relative to the center of recombination of said substructure.

As shown in FIG. 1 of the accompanying drawings, said slice or wafer can also comprise at least one supplemental amorphized substructure, very strongly doped, embedded in the emitter or in the base, in particular located for example at the level of the rear surface of the base, having a limited thickness, preferably between 20 and 400 nm, and delimited by two interfaces of the L-H type and by two crystalline hetero-interfaces when said supplemental substructure is disposed in the base or the emitter or by an interface of the L-H type and by a crystalline hetero-interface when said supplemental substructure is located directly at the level of the rear surface.

This supplemental substructure is preferably located in the base, preferably directly at the level of the rear surface, and has a strong conductivity selective to majority carriers thanks to a very highly active dopage, particularly greater than about $10^{19}$ cm$^{-3}$, preferably about 100 times greater than that of the neighboring base zones.

Thus, according to a third embodiment of the invention, said slice or wafer can comprise at least two types of substructure of which each is active in different portions of the spectrum, namely one, located in the emitter, active in the UV and the visible and having centers of generation below the gap in the emitter gathered in one or several thin substructures, and the other, preferably located in the base, having below the gap centers of photogeneration in the base gathered in at least one larger substructure.

As to the relative positioning of the homo-interfaces L-H and the crystalline hetero-interfaces delimiting the substructure, different configurations are possible, namely:
  the homo-interfaces L-H are overlapping the hetero-interfaces, at the level of the limits of each substructure, said hetero-interfaces being provided during their formation with electrical properties of the L-H type;
  the homo-interfaces L-H are located within each substructure defined by the hetero-interfaces after annealing, or enclose this latter between themselves by being located on opposite sides of the latter;
  one of the homo-interface couples L-H/hetero-interfaces overlaps and the other homo-interface L-H/hetero-interface is separate or distinct.

According to a preferred embodiment of the invention, the emitter has a thickness less than 1 $\mu$m and the P-N junction and the L-H junction form the rear field having a depth less than 1 $\mu$m.

Similarly, the thickness of the substructure or substructures present in the emitter is preferably comprised between 20 and 100 nm, said at least one substructure being located at a distance comprised between 50 and 700 nm from the front surface of the slice, wafer or chip region and having a strong selective conductivity for minority carriers thanks to its very high dopage, particularly greater than about $10^{19}$ cm$^{-3}$, preferably about 100 times greater at least than that of the neighboring emitter zones.

According to a characteristic of the invention, the slice or wafer has an effective confinement of the minority carriers in the emitter layer located between the front surface and the substructure at least present or the substructure the least embedded, and, as the case may be, between the different substructures present in the emitter, thanks to a low temperature passivation of said front surface and to the creation of a potential barrier at the level of each substructure resulting from the insertion of interfaces forming thus a reservoir of minority carriers, of optimum thickness, as a function particularly of the initial dopage, comprised between about 50 and 700 nm.

As a function of the type of cells desired, namely thin or thick, the slice or wafer could have either a total thickness comprised between about 120 $\mu$m and about 300 $\mu$m, or a thickness comprised between 3 $\mu$m and 120 $\mu$m and be counter-cemented on a rigid support, for example on a thin plate of stainless steel.

So as to explain the different preferred properties conferred, in terms of electronic transport, by the substructure forming a complex interface described above as well as the important parameters of this latter, reference will now be had to FIGS. 12 to 18 of the accompanying drawings.

The beneficial action of the complex interface on the electrical transport is translated first of all by an intrinsic electric field.

To this end, one can compared the distribution of this latter to that of the field of a gradual P-N junction (FIG. 12)

and study the distribution of the electrical potential (FIG. 13) in an emitter comprising a substructure according to the invention, for a rear field cell and for different lifetimes in the substructure (curve 1: 100 and $10^{-2}$ μs, curve 2: $10^{-6}$ is).

The electrical field of the complex interface L-H maintains the minority carriers spaced from the recombination zone, a lower effective concentration of the minorities implying thus a lower probability of recombination (BSF and HLE).

There can also be noted an improvement of the effective lifetime of the photogenerated carriers in the substructure described above, resulting from the intrinsic electric field of the interfaces L-H. As a result, there is an increase in the total number of electron-hole pairs that can take part in photoconduction, which translates into an improvement of short circuit current $I_{SC}$ notwithstanding the presence of supplemental recombination centers, particularly in the substructure.

Outside of the strongly doped substructure, which is to say the accumulation layer, several fractions of confined majority carriers have more or less bi-dimensional micromovements and the transverse section of the recombination centers changes adjacent the interfaces L-H.

Furthermore, the potential barrier L-H acts in a selective manner on the minority carriers in the volume (identical to the P-N junction but in the opposite direction), said carriers being thus held spaced from the centers of recombination of the substructure by virtue of the screen formed by said potential barriers, which permits maintaining good volumetric parameters of the rear field cell.

However, the effective concentration of minorities between the P-N junction and the substructure can be weaker by the HLE effect (see above) in comparison with the single cell with conventional rear field (without substructure, nor HLE) thereby reducing the obscurity saturation current $I_o$ and increasing, in a preferred manner, the voltage in the open circuit $V_{OC}$.

It results from the above that the photovoltaic material according to the invention has simultaneously a notable increase of photocurrent and of photoexcited voltage, relative to the active material used in present cells.

Among the important geometric factors, should be mentioned the distance from the P-N junction/substructure and the thickness of said substructure, which must be sufficiently low to permit preserving the fields (of constraint and electrical) which are relatively great across all its thickness.

FIGS. 14 and 15 show respectively, by way of comparison, different electron components (FIG. 14) and holes (FIG. 15) of the total current in three different emitters each provided with a thin substructure, strongly doped according to the invention, as a function of the position of this latter relative to the front surface, the sole parameter which differs between the three curves being the thickness of the substructure (curve 1: 160 nm, curve 2: 80 nm, curve 3: 40 nm), these results taking into account only the improvement in infrared.

FIGS. 16 nd 17 show respectively, by way of comparison, two electron components (FIG. 16) and of holes (FIG. 17) of the total current in two emitters each provided with a substructure of thickness 160 nm, as a function of the position relative to the front surface, the sole parameter differing between the two curves being the effective lifetime in the substructure (curve 1: $10^{-6}$ μs, curve 2: 100 μs).

The complex interfacial voltage barrier constitutes not only a screen for the equilibrium carriers but also for the photogenerated carriers in the frontal zone of the emitter located between the substructure and the front surface.

Thus, the concentration of carriers in permanent regime under illumination at the level of the front side of the emitter permits the formation of a reservoir of carriers (see FIG. 18—substructure with δ-dopage: $10^{20}$ cm$^{-3}$, depth: 0.5 nm and thickness: 40 nm).

However, it is known that in a non-degenerated semiconductor, the open circuit voltage is a function of the concentration of carriers, a greater concentration of carriers reducing the production of entropy of the cloud of electrons by photons and giving rise consequently, in a preferable manner, to an increase in the open circuit voltage.

Moreover, an important transformation of the electronic transport properties takes places in the emitter provided with a substructure of the type mentioned above, dependent on several geometric factors, particularly the thickness of the substructure.

Thus, FIGS. 14 and 15 show a development of the components of the density of the photocurrent. In the frontal zone of the emitter, the transport changes in nature by passing from conduction by diffusion of minorities to conduction by application of majorities. The minority carriers blocked in their movement toward the P-N junction form a concentration cluster (from the equilibrium distributions of the permanent regime) near the edge of the substructure (see FIG. 16).

In addition to the above, it has been noted that a slice or wafer of monocrystalline silicon treated according to the process according to the invention, so as to form a photovoltaic device with δ-dopage and rear fields such as described above, also has a better absorption in the visible range and a better photogeneration in these wavelengths, relative to a conventional solar cell with a rear field of high quality and of an output of about 16% (see FIGS. 19A and 19B).

In FIG. 19A of the accompanying drawings, the curve C1 corresponds to a photovoltaic device obtained by the process according to the invention, whilst curve C2 corresponds to the reference cell.

This improvement of photogeneration for a photovoltaic device according to the invention can be explained by the combined actions of the high dopage of the substructure (δ-dopage, electric field emptying the substructure of the minority carriers), of the intrinsic field of constraints in the transition zone α-Si/c-Si and of the geometry factors such as the position of the substructure or substructures relative to the zones of generation of the hot carriers (Auger).

The supplemental generation of additional carriers can also be explained by the phenomenon of generation by impacts with a low activation energy.

FIGS. 20A and 20B of the accompanying drawings, relative to FIGS. 19A and 19B, permit supporting the preceding explanation.

Thus, in the curves of differential characteristics and of ratios represented in FIGS. 20A and 20B, there can be easily distinguished two ranges of wavelength, namely, a first range corresponding to 300<λ<600 nm and in which the simplified cell (without passivation of the front surface) with δ-dopage and with rear field according to the invention has a lower photocurrent than the reference cell of very high quality (mentioned above) and, a second range corresponding to 600<λ<1100 nm and in which the photocurrent of the cell according to the invention is more important than that of the reference cell.

The first characteristic range can be explained easily by the presence of numerous centers of recombination at the front surface, not having been subjected to passivation, of the cell according to the invention.

As to the second characteristic range, its explanation can only be explained by the fact that the energy of a photon serves for the generation of more than two different free carriers. This observation is confirmed by results on the quantitative external efficiencies which are shown in FIGS. 20B, in which it will be noted that the substantially greater value with unity of the EQE factor (external quantitative efficiency) for wavelengths less than 1000 nm signifies that more than two carriers may be generated by a photon. The explanation of this phenomenon is to be found in the presence of a mechanism of generation by impacts at low energy, which constitutes a sort of ionization by impacts.

Because of the non-linear dependence of this additional photocurrent relative to the intensity of light flux, one can proceed to an estimate of the activation energy acting in this case.

So as to observe this phenomenon, comparative measures have been taken by operating two separate lamps (I and II) having in different spectral intensities and characteristics.

Thus, FIG. 21 of the accompanying drawings shows the light flux and the number of photons emitted, after correction, by each of two lamps, the first with a stronger luminous intensity and the second with a weaker luminous intensity.

The characteristic of non-linearity of the generation of carriers with the number of photons has been demonstrated by means of detailed analysis of additional photocurrents in the form of an analysis of the ratio/difference characteristics of the photocurrents (called R-DP procedure).

FIGS. 22A and 22B of the accompanying drawings show the relation between the photon flows and the generated photocurrents by means of differential values of the photon flow relative to the differential values of the photocurrents for the two lamps in question.

FIGS. 23A and 23B of the accompanying drawings permit comparing, for the two mentioned lamps, the ratio of photon flux with ratios of additional photocurrents generated in a device or a photovoltaic specimen according to the invention.

The supplemental figures confirm that this phenomenon of a subgap generation is present in the form of the generation of second carriers of the Auger type and that the corresponding activation energy is equivalent to that of a generation by low energy impacts.

The intrinsic constraint field combined with the intrinsic electric field existing at the transition zones of the substructure or substructures gives rise (according to a reorientation after application of thermal energy-thermal treatment of the substructure) to a configuration of divacancies favorable to the generation of secondary carriers mentioned above and a decrease of the energy necessary for the generation of the electron-hole pairs. This leads to a generation mechanism of the Auger type when the generated carriers survive because of an immediate extraction from the generation/recombination zone by the intrinsic electric field.

The observation of this phenomenon on such a large scale is due to the geometric separation of the two active zones, namely, the primary zone of the upper monocrystalline layer of the photovoltaic conversion, in which take place a creation of hot carriers, and the embedded substructure or substructures which is or are at the base of the generation of the Auger type.

The upper monocrystalline layer facilitates the action of two phenomena, namely, fundamental photogeneration in the surface zone (light of short wavelengths) and the movement of the carriers of the Auger type with a sufficient kinetic energy, toward the second zone of generation of the substructure.

Thus, there exists two types of generation of carriers, a direct generation by virtue of the fundamental optical absorption and an indirect generation connected to the creation of the hot carriers of the Auger type, this second generation being unable to be observed in the absence of the first. The cell or the photovoltaic device according to the invention thus comprises two active regions, namely, optical (fundamental absorption) and electronic (generation by impacts).

The generation of the hot carriers can obviously also take place directly in the amorphized layer or layers.

The preceding observations can also be explained from the theoretical point of view by analysis of the photocurrent equation of a photovoltaic device.

Thus, the photocurrent of a conventional cell is proportional to the incident light flux and can be expressed by the following formula:

$$I_{ph}=a\eta_r\beta_r\Phi(\lambda) \quad \text{(Eq. 1)}$$

in which a represents the homogeneity constant, $\beta_r(\lambda)=\alpha_r g_r$ represents the efficiency of absorption, $\alpha_r(\lambda)$ is the coefficient of absorption and $g_r$ is the geometric factor of the device under consideration taking account for the effective length of the optical train (above all for infrared radiation). The factor $\eta_r(\lambda)$ represents the efficiency of generation of the electron/hole pairs (quantitative output).

In a conventional cell, in which a photon can only be generated by an electron/hole pair, there is always $\eta_r(\lambda) <1$. In a first approximation, $\beta_r$ can be estimated by comparison with the spectral characteristics of $I_{ph}(\lambda)$ and $\Phi(\lambda)$ when a and $\eta_r(\lambda)$ are both equal to 1.

A formula equivalent to Eq. 1 for the cell with δ-dopage and rear field according to the invention can be established in the following form:

$$I_{ph}\text{-}\delta = a\ \eta\delta\beta\delta II\eta_M\delta_i\Phi(\lambda) \quad \text{(Eq. 2)}$$

In equation Eq. 2, $\eta_M\delta_i=1+P_M\delta_i$ represents the simple multiplication factor for the generation of secondary carriers of the Auger type for one, two or n events per photon (the index i indicating the number of events), $P_M\delta_i$ represents the probability of i events per photon, $\beta\delta(\lambda)\geq\beta_r(\lambda)$ is the efficiency of absorption in the present of an amorphized buried substructure or layer, $\beta\delta(\lambda)=(\alpha_r+\Delta\alpha)(g_r+\Delta g)\Delta\alpha(\lambda)$ represents the complex additional absorbent connected to a deepest penetration of the photons with luminous intensity and $\Delta g$ is the corresponding geometric factor, namely, a complex function of the situation/position of the embedded layer and of the distribution profile of absorption throughout the thickness of the device or the photovoltaic specimen.

Multiplication by $\eta_M\delta_i$ depends on the energy of the instant photons.

As to the energy of the absorbed photons, $h\nu\approx E_{gsi}+\Delta E$, and, when $\Delta E<E\delta$ then $II\eta_M\delta_i=1$. When $E\delta<\Delta E<2E\delta$, then $II\eta_M\delta_i=\eta_1=K_1$ ($\Delta E$, r) in which $1.0\leq K_1<2.0$. When $2E\delta<\Delta E<3E\delta$, then $II\eta_M\delta_i=\eta_1\ \eta_2=K_2$, in which $1.0\leq K_2<K_1$. When $3E\delta<\Delta E<4E\delta$, then $II\eta_M\delta_i=\eta_1\ \eta_2\ \eta_3=K_3$ with $1.0\leq K_3<K_2$. And so on.

In truth, all the factors $\eta_1, \eta_2, \eta_3, \ldots \eta_n$ are complex functions, as well as the resulting factors $K_1, K_2, K_3, \ldots K_n$ which depend on the additional energy available $\Delta E$ (rule of choice) and on the spatial parameter r which is a function of the position of the point of creation of the hot carrier in question and of the direction of its initial movement.

The multiplying factors $\eta_1, \eta_2, \eta_3, \ldots \eta_n$ corresponding to mean efficiencies (varying between 1 and 2) of one, two or n events per photon, their product accordingly cannot be less than unity.

Comparing two characteristic curves of photocurrents obtained with different illumination intensities, it will be noted that only the values of these multiplying factors differ. As a result, there is non-linear behavior of the differential characteristics of the photocurrents.

Considering the rule of choice of the divacancies in energetic space (rule of the gold hole) and the efficacy of absorption of the embedded layer $[\beta\delta(\lambda)=(\alpha_r+\Delta\alpha(\lambda))\ (g_r+\Delta g(\lambda))]$, it is possible to conclude that the photons having energies positioned on the lines $h\nu=(E_{gsi}+n\ E\delta)$ can be particularly effective when their conversion takes place in immediate proximity or within the amorphized substructure.

This explains the presence of characteristic peaks in FIGS. 22 and 23 mentioned above (R-DP process).

Moreover, the differential photocurrents observed in the preceding figures, comparing a conventional cell with a device or a photovoltaic specimen according to the invention, is explained not only in an increase of the intensity of incident photon flux but also by the fact of the substantially deeper penetration of the photon flux (optical absorption of amorphized silica) and by a more numerous generation of secondary carriers of the Auger type.

Although the above description refers principally to the presence of a single buried substructure within the emitter and adapted to have an effective photovoltaic conversion activity in the UV and visible ranges and in the infrared range, it can also be provided, according to the invention, and as already mentioned above, that the slice, wafer or chip region comprises several substructures distributed across the thickness of the emitter, of which each is provided with two combined mechanical/electrical constraint fields, one at least of said substructures having an increased or extended activity of photovoltaic conversion in the UV and visible ranges.

According to an additional characteristic of the invention, and as shown in FIG. 1 of the accompanying drawings, there can also be provided at least one amorphized supplemental substructure, very strongly doped, embedded in the emitter or in the base, in particular located for example at the level of the rear surface of the base, having a limited thickness, preferably between 20 and 400 nm, and delimited by at least one interface of the L-H type and by at least one crystalline hetero-interface.

This supplemental substructure will have an increased activity of photovoltaic conversion for infrared radiation thanks to a maximum suppression of divacancies during thermal treatment fixing the dimensional, geometric and morphological parameters of the substructure and of its interfaces.

Finally, the invention also has for its object a photovoltaic cell or photocell which comprises as active material a portion of a slice, a slice or a wafer of photovoltaic material such as is described above and obtained by the production method described above, at least the front or exposed surface of said slice portion, slice or wafer being shaped and/or covered with a layer of material so chosen as to constitute an optical confinement, particularly for infrared radiation, across the thickness of said active material, and hence between the front and rear surfaces of said cell or between said substructures.

In addition to the recited active material, said photopile will comprise different other coatings and layers and will be the object of supplemental treatments, not described in the present text, but which are known to those in the art.

By way of example, FIG. 1 shows the construction of an embodiment of a multi-interface solar cell with very high or ultra high output, comprising a modified substructure absorbing infrared, embedded in the emitter. In this figure, there can be noted, in addition to regions corresponding to the emitter, the base, the rear field region, the P-N junction and the substructure, the different layers or interfacial zones forming such a functional solar cell:

coating or front antireflection layer (optical activity—limitation of surface reflection)

1: front surface of the cell (exposed surface)—upper limit of the antireflection coating layer;

between 1 and 2: antireflection coating.

front passivation layer (electronic activity—limitation of the charge of recombination of the front surface or of the exposed or forward surface)

2: front interface between the antireflection coating and the passivation layer;

between 2 and 3: front passivation layer;

4: interface of the frontal metal/semiconductor contact zone; useful local recombination of free carriers;

3: front interface between the monocrystalline layers and passivation layers; useful local recombination of free carriers.

emitter (optical and electronic activities—conversion of short wavelength light, generation by impact, trapping light, excess carriers reservoir, electronic transport)

between 3 and 5: optically active zone; monocrystalline region of absorption of sunlight of short wavelength; most effective zone of photogeneration, screen for minority carriers of the saturation current;

5: rear limit of absorption of sunlight of short wavelength in the emitter;

between 3, 5 and 6: reservoir of minority carriers comprised of two distinct subregions: photon/photo-carrier conversion and electronic transport of the excess carriers.

substructure (optical and electronic activities, conversion of UV and visible light with an output exceeding unity, optical confinement, preservation of minority carriers, creation of a voltage barrier, electronic transport)

6: front limit of the upper L-H accumulation layer;

between 6 and 7: upper accumulation layer of small depth; bi-dimensionalization of the micromovement of the majority carriers;

7: front L-H interface; electrical limit of the substructure;

between 7 and 8: front electrical extension of the substructure; monocrystalline structure;

in 8: front interface of the substructure; structural limit or hetero-interface;

between 8 and 9: optically active zone; region of modified crystallinity, as the case may be amorphous, for the generation by impacts, associated with an instantaneous evacuation of the photogenerated minority carriers;

9: rear interface of the substructure; structural limit or hetero-interface;

between 9 and 10: rear electrical extension of the substructure; monocrystalline structure;

10: rear L-H interface; electrical limit of the substructure;

between 10 and 11: deep accumulation layer; bi-dimensionalization of the micromovement of the majority carriers;

11: rear limit of the deep layer of L-H accumulation;

6, 7, 8, 9, 10 and 11: absorbent substructure.

P-N junction (optical and electronic activities—collection of excess minority photocarriers, creation of a voltage barrier, electronic transport)

12: limit of non-linear P-N distributions within the emitter;

between 12 and 13: volume P-N load with distribution of free carriers in the emitter;

13: frontal limit of the P-N volumetric load;

between 13 and 14: layer of volumetric load of the donors with a negligible concentration of free carriers;

14: P-N interface;

between 14 and 15: volumetric load layer of the acceptors with a negligible concentration of free carriers;

15: rear limit of the P-N volumetric load;

between 15 and 16: P-N volumetric load with a distribution of free carriers in the base;

16: limit of the non-linear P-N distributions in the base.

base (electronic activity—transportation of excess minority photocarriers—absorption of long wavelength radiations of solar radiation—additional absorption below gap of the red and infrared radiations—trapping of light—diffusion of the trajectories—angle of reflection)

between 16 and 17: layer forming the base; maximization of the lifetime of the minority carriers, elimination of non-photogenerated absorption of long wavelength light and of dark recombination, limitation of series resistance.

rear surface field (electronic activity—preservation of the excess minority photocarriers, electronic transport)

17: front or forward limit of the rear field accumulation layer (BSF);

between 17 and 18: rear field accumulation layer;

18: L-H interface of the rear field; bi-dimensionalism of the micromovement of the majority carriers;

between 18 and 19: depletion layer of the rear field;

19: rear limit of the depletion layer of the rear field;

between 19 and 20: H region of an L-H interface ($p^+$ in a $n^+/p/p^+$ cell), this region being adapted to constitute, according to an auto-implantation with high dosage and a suitable thermal treatment, an amorphized supplemental substructure 25 dedicated exclusively to the photovoltaic conversion of infrared radiation.

rear passivation layer (electronic activity; limitation of the recombination load of the rear surface)

20: rear interface between the monocrystalline passivation layers; useless local recombination of the free carriers;

21: interface of the rear contact zone metal/semiconductor; local useful recombination of the free carriers;

between 20 and 22: rear passivation layer.

rear reflection coating or layer (optical activity—maximization of reflection on the rear surface)

22: rear interface between reflecting coating and passivation layer;

between 23 and 24: rear reflection coating;

24: rear surface of the cell: lower limit of the reflection layer.

Thanks to the invention, it is thus possible to produce, easily and in an industrial manner, a silica base material absorbing infrared radiation as well as fundamental radiation absorbed normally by the silicon and converting, in a corresponding usable supplemental photocurrent, said infrared absorption, by implanting in the emitter zone a continuous strongly doped substructure delimited by two homo-interfaces L-H and two hetero-interfaces, so as to constitute a complex interface forming a second voltage barrier and comprising an intrinsic field ensuring an effective extraction of the pairs of photogenerated carriers in said substructure by the absorption of luminous radiation of long wavelength (red, infrared).

The strongly doped substructure thus confers on the solar cell new optical and electronic properties, namely:

an enlargement of the absorption spectrum of the monocrystalline silicon and conversion of the supplemental absorption into electrons-hole pairs photogenerated and extracted from the substructure;

prevention of the instantaneous recombination of the photogenerated carriers in the substructure by an intrinsic electric field of the complex interface;

an improvement of the (effective) lifetime of the minority carriers in the emitter with the substructure;

an improvement of the spectral response in UV and visible radiation (quantitative output exceeding unit);

electrical transparency of the substructure relative to the electronic transport;

an increase of the short circuit current ISC;

the creation of a high concentration of minority carriers (reservoirs of carriers at the level of the superficial zone of the emitter by effects of passivation and of voltage barrier);

an increase of the open circuit voltage VOC.

Of course, the invention is not limited to the embodiments described and shown in the accompanying drawings. Modifications remain possible, particularly as to the construction of the various elements or steps, or by substitution of technical equivalents, without thereby departing from the scope of protection of the invention.

I claim:

1. Process for the production of a photovoltaic material or device based on monocrystalline or polycrystalline large grain silicon, adapted to absorb particularly infrared radiation, characterized in that it consists in obtaining a wafer, a slice or a chip region of monocrystalline or polycrystalline large grain silicon having a diffusion length greater than the path of the minorities in the base or greater than the total thickness of said wafer, slice or chip region, then treating the rear surface of said wafer, slice or chip region, not adapted to be exposed to photovoltaic radiation, so as to create a rear field as well as zones or points of electrical contact, then treating the forward surface so as to form a thin surface emitter layer, a P-N junction of shallow depth, as well as at least one continuous flat substructure strongly doped, embedded in the emitter or in the base, of very small thickness and provided with several crystalline and electrical interfaces, particularly two interfaces of the L-H type and two crystalline hetero-interfaces and, finally, subjecting said slice, wafer or chip region, particularly the surface having the emitter, to a thermal treatment, for predetermined times and temperatures, so as to obtain in the emitter layer a hetero-structure of different materials or of materials of different crystallinities, particularly a structure with at least three layers of the monocrystalline silicon/amorphous silicon or modified/monocrystalline silicon type, coinciding with the doping profile adopted and comprising intrinsic fields of mechanical and electrical constraints at the level of the transition zones.

2. Process according to claim 1, characterized in that the treatment of the forward surface consists in introducing or implanting doping impurities according to a predetermined profile, having particularly an important peak of concentration of impurities coinciding with each substructure, the consecutive thermal treatment providing a determination of the geometry of each substructure, an activation of the doping impurities and of intrinsic fields localized in transition zones and a recovery of the implantation defects of doping impurities of ions in the thickness of the slice, the wafer or the chip region, with limited effect at the level of each embedded substructure.

3. Process according to claim 2, characterized in that the energy of implantation of the doping impurities used is of the order of several tens or hundreds of KeV, particularly greater than about 150 KeV, and in that the implantation dose used corresponds to an ion current of the order of several $\mu A.\ cm^{-2}$ or of several fractions of $\mu A.\ cm^{-2}$, particularly below 1 $\mu A.\ cm^{-2}$.

4. Process according to claim 1, characterized in that it consists, during treatment of the front surface, in providing an epitaxy or an implantation at a given depth, of an active material, particularly of Ge, followed if desired by a thermal treatment and a possible epitaxy of silicon adapted to form the superficial front surface of the emitter, as well as active generation zones by impact.

5. Process according to claim 1, characterized in that it consists in providing the slice, wafer or chip region with a rear field and having good crystalline quality, first at least an amorphized layer having optical properties permitting absorption of infrared radiation, then subjecting to a conventional epitaxial growth an emitter with at least two doping levels, the weaker on the side of the P-N junction and the higher on the side of the front surface, these two regions of different doping level being separated by at least one substructure or very thin and strongly doped embedded layer.

6. Process according to claim 1, characterized in that the treatment of the front surface consists in providing an epitaxial increase of the emitter, with a doping profile comprising particularly at least one continuous flat very strongly doped layer constituting the substructure or substructures embedded in the thickness of the emitter, then subjecting said front surface to the implantation of ions of a neutral agent such as particularly hydrogen, silicon or the like and a thermal treatment forming particularly the active zones of generation by impacts.

7. Process according to claim 6, characterized in that it consists, after implantation of ions of a neutral agent, in subjecting particularly the emitter to a thermal treatment adapted on the one hand to provide a determination of the geometry of the substructure or substructures, an activation of the doping impurities and a recovery of the implantation defects of the ions of neutral agent in the thickness of the slice, the wafer or the chip region, with limited effect in the embedded substructure or substructures and, on the other hand, to modify the crystallinity of the substructure or substructures at the level of the zones of electrical transition and constraints and the opto-electronic properties at the mesoscopic level by a repositioning of the hetero-interfaces and the L-H homo-interfaces by an effective recrystallization and rediffusion.

8. Process according to claim 1, characterized in that the thermal treatment consists in a conventional annealing, continuous or by separate stages, at a temperature equal to or less than about 500° C., followed if desired by a rapid annealing at a temperature comprised between 500° C. and 1200° C., preferably about 1000° C., of the front superficial surface zone alone, producing a planification and a final crystalline and electric formation of the interfaces of the flat substructure or substructures embedded in the emitter, leading to the formation, on the one hand, of two flat L-H homo-interfaces, gradual or abrupt, located at the level of the limits of each substructure after the operation of doping by epitaxy or implantation and, on the other hand, of two flat hetero-interfaces delimiting each substructure after the crystalline modification and the formation of the transition zones due to annealing.

9. Process according to claim 8, characterized in that the duration of conventional annealing is comprised by an interval of about 1 to 30 minutes, as a function of the desired consecutive thermal steps and of the thermal conditions of the substrate, the precise instant of stopping said thermal treatment being determined by the verification of the absorption of luminous radiation of a given wavelength or of a range of given wavelengths, particularly in the field of red and near infrared.

10. Process according to claim 8, characterized in that the L-H homo-interfaces are overlapped, two by two, with the hetero-interfaces, at the level of the limits of each substructure, said hetero-interfaces being provided during their formation with electrical properties of the L-H type.

11. Process according to claim 9, characterized in that the thermal treatment consists in a conventional annealing at a temperature less than or equal to about 500° C., of the assembly of the slice, wafer or chip region, followed by rapid annealing at a temperature higher than or equal to 500° C. of the superficial region of the rear surface, comprising particularly said supplemental substructure.

12. Process according to claim 8, characterized in that the L-H homo-interfaces are located within each substructure defined by the hetero-interfaces after annealing, or enclose this latter between themselves by being located on opposite sides of the latter.

13. Process according to claim 8, characterized in that, for a given substructure, one of the L-H homo-interface/hetero-interface couples is overlapping and in that the other L-H homo-interface/hetero-interface is separate or distinct.

14. Process according to claim 1, characterized in that it consists in providing, after the operation of thermal treatments, a low temperature passivation of the front surface of the slice, wafer or chip region adapted to be exposed to luminous radiation.

15. Process according to claim 1, characterized in that the starting silicon material consists in monocrystalline or polycrystalline silicon, with a concentration of doping impurities comprised between $5\times10-cm^{-3}$ and $5\times10^{17}\ cm^{-3}$, said material not having impurities being adapted to be activated by the implantation energy and the thermal treatment and having self-recovery properties of its crystalline structure during implantation and recovery of its crystalline structure by conventional annealing at low temperature, below 500° C.

16. Process according to claim 1, characterized in that the emitter has a thickness less than 1 $\mu m$ and in that the P-N junction and the L-H junction forming the rear field have a depth less than 1 $\mu m$.

17. Process according to claim 1, characterized in that the final thickness of the substructure or substructures present in the emitter is comprised between 20 and 100 nm, said substructure at least present being located at a distance comprised between 50 and 700 nm from the front surface of the slice, wafer or chip region and having a high selective conductivity of majority carriers thanks to its very high dopage, higher particularly than about $10^{19}\ cm^{-3}$, preferably about 100 times greater than the dopage of the emitter.

18. Process according to claim 1, characterized in that it consists in providing a single embedded substructure in the emitter and adapted to have an effective photovoltaic conversion activity simultaneously in the UV and visible ranges and in that infrared range.

19. Process according to claim 1, characterized in that it consists in providing several substructures distributed across the thickness of the emitter, of which each is provided with two combined fields, namely a mechanical constraint field and an electrical field, by effecting successively an implantation of an active material in one wafer or slice of monocrystalline silicon, followed by an epitaxy in solid, liquid or gaseous phase.

20. Process according to claim 1, characterized in that it consists in creating at least one supplemental amorphized substructure, very strongly doped, embedded in the emitter or in the base, in particular located for example at the level of the rear surface of the base, having a limited thickness and delimited by two interfaces of the L-H type and by two crystalline hetero-interfaces or one interface of the L-H type and one crystalline hetero-interface when the supplemental substructure is located at the level of the rear surface.

21. Process according to claim 20, characterized in that it consists in providing the supplemental substructure, having an increased activity of photovoltaic conversion for infrared radiation, by creating a rear field in the wafer or slice of monocrystalline silicon doped with boron, by diffusion of aluminum for example, by operating an auto-implantation of silicon with relatively high doses, particularly greater than $10^{15}$ cm$^{-3}$ for example, to obtain amorphization of a layer, whose thickness is for example comprised between 20 and 400 nm, across the thickness of the substrate and, finally, by providing a thermal treatment of the wafer or slice, to reach a planification of the interfaces of said substructure and of the transition zones, and a maximum suppression of the activity of the divacancies.

22. Process according to claim 20, characterized in that it consists in providing the supplemental substructure, having an increased activity of photovoltaic conversion for infrared radiation, by effecting an implantation at high dosage, particularly greater than $10^{15}$ cm$^{-3}$, with a doping impurity, such as for example aluminum, forming the rear field and the hetero-interface of the L-H type and then effecting a thermal treatment to reach a planification of the interfaces and of the transition zones of said substructure, at a maximum suppression of the divacancies.

23. Process according to claim 1, characterized in that the final structure of the slice or wafer, initially doped p, is of the emitter/base/region type of rear field with respective dopings n$^+$/p/p$^+$, the implanted doping impurities being selected from the group comprised by phosphorus, antimony and arsenic, particularly by the embedded substructure or substructures in the emitter.

24. Process according to claim 1, characterized in that the final structure of the slice or wafer, initially doped n, is of the emitter/base/region type of rear field with respective dopings p$^+$/n/n$^+$, the doping impurities being selected from the group formed by aluminum, boron, gallium and indium.

25. Process according to claim 1, characterized in that the slice or wafer of silicon has a total thickness comprised between 120 µm and about 300 µm.

26. Process according to claim 1, characterized in that the slice or wafer of initial silicon has a thickness comprised between 3 µm and 120 µm and is counter-cemented on a rigid support, for example on a thin plate of stainless steel.

27. Process according to claim 1, characterized in that the slice, wafer or chip region has an effective confinement of minority carriers in the emitter layer located between the front surface and the substructure at least present or the substructure the least embedded and, as the case may be, between the different substructures present in the emitter, thanks to a low temperature passivation of said front surface and to the creation of a voltage barrier at the level of each substructure resulting from the insertion of the interfaces forming thus a reservoir for minority carriers of optimum thickness, as a function particularly of the initial doping, comprised between about 50 and 700 nm.

28. Process according to claim 1, characterized in that it consists in providing a supplemental treatment at least of the front surface of the slice, wafer or chip region, by superficial configuration and/or coating with a layer of a predetermined material, so as to carry out an internal or external optical confinement across the thickness of said slice, wafer or chip region, particularly for the luminous red or infrared radiation.

29. Slice or wafer of photovoltaic material obtained by means of the production process according to claim 1, consisting essentially of monocrystalline or polycrystalline silicon of large grains and comprising a layer forming an emitter at the level of its front surface or adapted to be exposed, a rear field structure at the level of its rear surface and a P-N junction across the thickness of said slice or wafer, characterized in that it comprises moreover at least one continuous substructure strongly doped with amorphized or modified silicon, embedded in the thickness of the emitter and/or in the thickness of the base and of very small thickness, said substructure having a resistivity less than that of the starting material and being delimited by crystalline and flat electric interfaces, particularly by two flat crystalline hetero-interfaces and two L-H homo-interfaces, overlapping or not with the hetero-interfaces and corresponding to the limits of the substructure after implantation of the doping impurities or other agents and before formative annealing, said at least one substructure being moreover provided, on the one hand, with opposite intrinsic electrical fields formed at the level of each L-H homo-interface favoring the extraction of the photogenerated minority carriers in said substructure and, on the other hand, of intrinsic constraint fields formed at the level of each α-Si/c-Si hetero-interface promoting the preservation of the centers of generation by impact, said slice or wafer thus constituting a multi-interface photovoltaic device.

30. Slice or wafer according to claim 29, characterized in that it comprises a single substructure buried in the emitter and adapted to have an effective photovoltaic conversion activity simultaneously in the UV and in the visible and in the infrared ranges.

31. Slice or wafer according to claim 29, characterized in that it comprises several substructures distributed across the thickness of the emitter, of which each is provided with two combined fields, namely a field of mechanical constraint and an electrical field, at least one of said substructures having an increased or extended activity for photovoltaic conversion in the UV and visible ranges.

32. Slice or wafer according to claim 29, characterized in that it comprises at least one amorphized supplemental substructure, very strongly doped, embedded in the emitter or in the base, in particular located for example at the level of the rear surface of the base, having a limited thickness, preferably between 20 and 400 nm, and delimited by two interfaces of the L-H type and by two crystalline hetero-interfaces when said supplemental substructure is disposed in the base or emitter or by an interface of the L-H type and by a crystalline hetero-interface when said supplemental substructure is located directly at the level of the rear surface.

33. Slice or wafer according to claim 32, characterized in that the supplemental substructure is located in the base, preferably directly at the level of the rear surface, and has a high selective conductivity of majority carriers thanks to a highly elevated active dopage, particularly greater than about $10^{19}$ cm$^{-3}$, preferably about 100 times greater than that of the neighboring base zones.

34. Slice or wafer according to claim 29, characterized in that the L-H homo-interfaces overlap the hetero-interfaces, at the level of the limits of each substructure, said hetero-interfaces being provided during their formation with electrical properties of the L-H type.

35. Slice or wafer according to claim 29, characterized in that the L-H homo-interfaces are located within each substructure defined by the hetero-interfaces after annealing, or enclose this latter within themselves by being located on opposite sides of the latter.

36. Slice or wafer according to claim 29, characterized in that, for a given substructure, one of the L-H homo-interface/hetero-interface couples is overlapping and in that the other L-H homo-interface/hetero-interface couple is separate or distinct.

37. Slice or wafer according to claim 29, characterized in that the emitter has a thickness less than 1 μm and in that the P-N junction and the L-H junction forming the rear field have a depth less than 1 μm.

38. Slice or wafer according to claim 29, characterized in that the thickness of the substructure at least present in the emitter is comprised between 20 and 100 nm, said substructure being located at a distance comprised between 50 and 700 nm from the front surface of the slice, wafer or chip region and having a high selective conductivity for majority carriers thanks to its very high active dopage, higher particularly than about $10^{19}$ cm$^{-3}$, preferably about 100 times greater than that of the neighboring emitter zones.

39. Slice or wafer according to claim 29, characterized in that it comprises at least two types of substructure of which each is active in different spectral portions, namely one, located in the emitter, being active in UV and visible light and having centers of below gap generation in the emitter disposed within one or several thin substructures and the other preferably located in the base having centers of photogeneration below the gap in the base collected in at least one large substructure.

40. Slice or wafer according to claim 29, characterized in that the slice or wafer of silicon has an effective confinement of the minority carriers within the emitter layer located between the front surface and the substructure at least present in the emitter or the substructure which is the least embedded and, as the case may be, between the different substructures present in the emitter, thanks to a low temperature passivation of said front surface and to the creation of a voltage barrier at the level of each substructure resulting from the insertion of interfaces thus forming a reservoir of minority carriers of optimum thickness, as a function particularly of the initial doping, comprised between about 50 and 700 nm.

41. Slice or wafer according to claim 29, characterized in that it has a total thickness comprised between about 120 μm and about 300 μm.

42. Slice or wafer according to claim 29, characterized in that it has a thickness comprised between approximately 3 μm and 120 μm and is counter-cemented on a rigid support, for example on a thin plate of stainless steel.

43. Photovoltaic cell or photopile, characterized in that it comprises as active material a portion of a slice, a slice or a wafer of photovoltaic material according to claim 29, at least the exposed surface of said portion of slice or wafer being shaped and/or covered with a layer of a predetermined material such as to constitute an internal and/or external optical confinement, particularly for infrared radiation, across the thickness of said active material.

* * * * *